US012287390B2

(12) United States Patent
Fortney

(10) Patent No.: US 12,287,390 B2
(45) Date of Patent: *Apr. 29, 2025

(54) HYBRID DIGITAL AND ANALOG SIGNAL GENERATION SYSTEMS AND METHODS

(71) Applicant: Lake Shore Cryotronics, Inc., Westerville, OH (US)

(72) Inventor: Houston Fortney, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/601,300

(22) Filed: Mar. 11, 2024

(65) Prior Publication Data
US 2024/0219505 A1 Jul. 4, 2024

Related U.S. Application Data

(63) Continuation of application No. 17/241,458, filed on Apr. 27, 2021, now Pat. No. 11,959,991.
(Continued)

(51) Int. Cl.
*G01R 35/00* (2006.01)
*G01R 19/25* (2006.01)
(Continued)

(52) U.S. Cl.
CPC .......... *G01R 35/005* (2013.01); *G01R 19/25* (2013.01); *G01R 31/2841* (2013.01);
(Continued)

(58) Field of Classification Search
CPC .. G01R 35/005; G01R 19/25; G01R 31/2841; H03M 1/0845; H03M 1/121; H03M 1/188
See application file for complete search history.

(56) References Cited

U.S. PATENT DOCUMENTS 3,293,556 A 12/1966 Kotzebue et al.
3,424,981 A 1/1969 Erdman
(Continued)

FOREIGN PATENT DOCUMENTS

EP 119711 A1 9/1984
EP 559657 B1 10/1994
(Continued)

OTHER PUBLICATIONS

Office Action from CN Application No. 202180031617.8 dated Feb. 28, 2024.
(Continued)

*Primary Examiner* — Joseph J Lauture
(74) *Attorney, Agent, or Firm* — Calfee, Halter & Griswold LLP

(57) ABSTRACT

An analog signal generating source comprising two or more digital-to-analog converters (DAC) combined to generate one or more frequency components. The analog signal source comprises a first path for generating substantially low frequency signals, the first path comprising a first one of the DACs; and a second path for generating substantially high frequency signals, the second path comprising a second one of the DACs. The analog signal source also comprises a data processor for processing an input signal and providing the processed input signal to the first and second paths; a combining circuit configured to combine outputs of the first and second paths into the source signal; a feedback portion configured to sense the source signal; and a servo loop configured to use the sensed source signal to adjust as need to maintain the source signal to substantially agree with the input signal.

21 Claims, 27 Drawing Sheets

Related U.S. Application Data

(60) Provisional application No. 63/057,745, filed on Jul. 28, 2020, provisional application No. 63/034,052, filed on Jun. 3, 2020, provisional application No. 63/016,747, filed on Apr. 28, 2020.

(51) Int. Cl.
  *G01R 31/28* (2006.01)
  *H03M 1/08* (2006.01)
  *H03M 1/12* (2006.01)
  *H03M 1/18* (2006.01)

(52) U.S. Cl.
  CPC ........ *H03M 1/0845* (2013.01); *H03M 1/121* (2013.01); *H03M 1/188* (2013.01)

(56) References Cited

U.S. PATENT DOCUMENTS

| | | |
|---|---|---|
| 3,467,958 A | 9/1969 | McKinney |
| 3,509,558 A | 4/1970 | Cancro |
| 3,626,252 A | 12/1971 | Cath |
| 3,654,560 A | 4/1972 | Cath et al. |
| 3,757,216 A | 9/1973 | Kurtin et al. |
| 3,757,241 A | 9/1973 | Kime et al. |
| 3,820,112 A | 6/1974 | RotH |
| 3,855,589 A | 12/1974 | SolendeR |
| 3,875,506 A | 4/1975 | Cath et al. |
| 3,979,642 A | 9/1976 | Cath et al. |
| 4,069,479 A | 1/1978 | Carpenter et al. |
| 4,127,811 A | 11/1978 | Gookin, Jr. et al. |
| 4,129,864 A | 12/1978 | Yee et al. |
| 4,383,247 A | 5/1983 | Assard |
| 4,449,120 A | 5/1984 | Rialan et al. |
| 4,542,346 A | 9/1985 | McNeilly |
| 4,544,917 A | 10/1985 | Lenhoff, Jr. |
| 4,564,018 A | 1/1986 | Hutchison et al. |
| 4,598,253 A | 7/1986 | Reindel et al. |
| 4,652,882 A | 3/1987 | Shovlin et al. |
| 4,674,062 A | 6/1987 | Premerlani |
| 4,733,217 A | 3/1988 | Dingwall |
| 4,807,146 A | 2/1989 | Goodrich et al. |
| 4,823,129 A | 4/1989 | Nelson |
| 4,847,523 A | 7/1989 | Schneider |
| 4,868,571 A | 9/1989 | Inamasu |
| 4,914,677 A | 4/1990 | Yamaguchi et al. |
| 4,999,628 A | 3/1991 | Kakubo et al. |
| 5,015,963 A | 5/1991 | Sutton |
| 5,023,552 A | 6/1991 | Mehlkopf et al. |
| 5,039,934 A | 8/1991 | Banaska |
| 5,111,202 A | 5/1992 | Rivera et al. |
| 5,144,154 A | 9/1992 | Banaska |
| 5,210,484 A | 5/1993 | Remillard et al. |
| 5,250,948 A | 10/1993 | Berstein et al. |
| 5,353,027 A | 10/1994 | Vorenkamp et al. |
| 5,382,956 A | 1/1995 | Baumgartner et al. |
| 5,386,188 A | 1/1995 | Minneman et al. |
| 5,414,348 A | 5/1995 | Niemann |
| 5,422,643 A | 6/1995 | Chu et al. |
| 5,490,325 A | 2/1996 | Niemann et al. |
| 5,491,548 A | 2/1996 | Bell et al. |
| 5,684,480 A | 11/1997 | Jansson |
| 5,687,051 A | 11/1997 | Seong et al. |
| 5,777,569 A | 7/1998 | Naruki et al. |
| 5,807,272 A | 9/1998 | Kun et al. |
| 5,886,530 A | 3/1999 | Fasnacht et al. |
| 5,999,002 A | 12/1999 | Fasnacht et al. |
| 6,031,478 A | 2/2000 | Oberhammer et al. |
| 6,069,484 A | 5/2000 | Sobolewski et al. |
| 6,100,832 A | 8/2000 | Uesugi |
| 6,104,329 A | 8/2000 | Kawano |
| 6,271,780 B1 | 8/2001 | Gong et al. |
| 6,317,065 B1 | 11/2001 | Raleigh et al. |
| 6,333,707 B1 | 12/2001 | Oberhammer et al. |
| 6,445,328 B1 | 9/2002 | Francis |
| 6,501,255 B2 | 12/2002 | Pomeroy |
| 6,621,433 B1 | 9/2003 | Hertz |
| 6,636,319 B1 | 10/2003 | Auth et al. |
| 6,683,552 B2 | 1/2004 | Noll et al. |
| 6,949,734 B2 | 9/2005 | Neff et al. |
| 6,977,502 B1 | 12/2005 | Hertz |
| 7,123,894 B2 | 10/2006 | Hessel et al. |
| 7,167,655 B2 | 1/2007 | Olivier |
| 7,248,199 B2 | 7/2007 | Asano et al. |
| 7,253,680 B2 | 8/2007 | Laletin |
| 7,365,664 B2 | 4/2008 | Caduff et al. |
| 7,590,196 B2 | 9/2009 | Gibbs |
| 7,636,386 B2 | 12/2009 | McCune, Jr. et al. |
| 7,676,208 B2 | 3/2010 | Hwang et al. |
| 7,903,008 B2 | 3/2011 | Regier |
| 7,923,985 B2 | 4/2011 | Goeke et al. |
| 8,009,075 B2 | 8/2011 | Currivan et al. |
| 8,027,112 B2 | 9/2011 | Jia |
| 8,180,309 B2 | 5/2012 | Kimmig et al. |
| 8,212,697 B2 | 7/2012 | Jansson et al. |
| 8,507,802 B1 | 8/2013 | Knauer |
| 8,571,152 B1 | 10/2013 | Chen et al. |
| 8,797,025 B2 | 8/2014 | Regier et al. |
| 8,841,964 B2 | 9/2014 | Hafizovic et al. |
| 8,860,505 B2 | 10/2014 | Hafizovic et al. |
| 9,007,250 B1 | 4/2015 | Jeraj et al. |
| 9,244,103 B1 | 1/2016 | Haviland et al. |
| 9,323,878 B2 | 4/2016 | Shepherd et al. |
| 9,324,545 B2 | 4/2016 | Green et al. |
| 9,362,935 B2 | 6/2016 | Chen et al. |
| 9,575,105 B1 | 2/2017 | Witt et al. |
| 9,645,193 B2 | 5/2017 | Niemann |
| 9,654,134 B2 | 5/2017 | Popovich et al. |
| 9,778,666 B2 | 10/2017 | Sobolewski |
| 10,284,217 B1 | 5/2019 | Schneider et al. |
| 10,305,498 B1 | 5/2019 | Summers |
| 10,404,215 B2 | 9/2019 | Motzkau et al. |
| 11,146,298 B2 | 10/2021 | Martin |
| 11,550,015 B2 | 1/2023 | Fortney |
| 11,762,050 B2 | 9/2023 | Fortney et al. |
| 11,959,991 B2 * | 4/2024 | Fortney .............. G01R 31/2841 |
| 2004/0162694 A1 | 8/2004 | Ricca et al. |
| 2005/0218971 A1 | 10/2005 | Elfman |
| 2007/0182429 A1 | 8/2007 | Goeke |
| 2008/0008198 A1 | 1/2008 | Young et al. |
| 2008/0221805 A1 | 9/2008 | Andrews |
| 2009/0273338 A1 | 11/2009 | Goeke et al. |
| 2010/0103016 A1 | 4/2010 | Thomas et al. |
| 2011/0074476 A1 | 3/2011 | Heer et al. |
| 2012/0112949 A1 | 5/2012 | Morgan |
| 2013/0033947 A1 | 2/2013 | Passerini et al. |
| 2013/0082854 A1 | 4/2013 | Keane |
| 2014/0145729 A1 | 5/2014 | Sobolewski |
| 2014/0354354 A1 | 12/2014 | Goeke |
| 2015/0019148 A1 | 1/2015 | Spanier et al. |
| 2015/0168529 A1 | 6/2015 | Regier et al. |
| 2015/0280648 A1 | 10/2015 | Vitali |
| 2016/0344401 A1 | 11/2016 | La Grou |
| 2017/0184415 A1 | 6/2017 | Vitali |
| 2020/0200821 A1 | 6/2020 | Freidhof et al. |
| 2021/0333348 A1 | 10/2021 | Fortney et al. |
| 2021/0336628 A1 | 10/2021 | Fortney |
| 2021/0336629 A1 | 10/2021 | Fortney |
| 2023/0039369 A1 | 2/2023 | Fortney |

FOREIGN PATENT DOCUMENTS

| | | |
|---|---|---|
| EP | 1111795 A2 | 6/2001 |
| EP | 707383 B1 | 5/2002 |
| EP | 883250 B1 | 9/2004 |
| EP | 821241 B1 | 10/2005 |
| EP | 1655848 B1 | 11/2008 |
| EP | 3035062 A2 | 6/2016 |
| EP | 3508865 A1 | 7/2019 |
| TW | 201349759 A | 12/2013 |
| WO | 03009478 A2 | 1/2003 |

(56) References Cited

FOREIGN PATENT DOCUMENTS

| WO | 2006105880 A1 | 10/2006 |
| WO | 2009143635 A1 | 12/2009 |

OTHER PUBLICATIONS

Office Action from JP Application No. 2022-565605 dated Apr. 5, 2024.
Office Action from TW Application No. 11011543 dated Feb. 29, 2024.
Office Action from TW Application No. 112139565 dated Feb. 19, 2024.
Office Action from JP Application No. 2022-565607 dated May 2, 2024.
Office Action from KR Application No. 10-2022-7041609 dated May 16, 2024.
Office Action from KR Application No. 10-2022-7041610 dated Jun. 27, 2024.
International Search Report and Written Opinion from PCT/US2021/029328 dated Jul. 20, 2021.
International Search Report and Written Opinion from PCT/US2021/029335 dated Aug. 5, 2021.
International Search Report and Written Opinion from PCT/US2021/029332 dated Aug. 12, 2021.
Office Action from U.S. Appl. No. 17/241,450 dated Feb. 17, 2022.
Notice of Allowance from U.S. Appl. No. 17/241,450 dated Jul. 22, 2022.
Office Action from U.S. Appl. No. 17/241,458 dated Aug. 17, 2023.
Notice of Allowance from U.S. Appl. No. 17/241,458 dated Dec. 12, 2023.
Office Action from U.S. Appl. No. 17/241,472 dated Nov. 22, 2022.
Notice of Allowance from U.S. Appl. No. 17/241,472 dated Apr. 24, 2023.
Office Action from U.S. Appl. No. 17/962,750 dated Apr. 13, 2023.
Office Action from U.S. Appl. No. 17/962,750 dated Aug. 9, 2023.
Notice of Allowance from U.S. Appl. No. 17/962,750 dated Jan. 10, 2024.
Office Action from CN Application No. 202180031617.8 dated Jun. 8, 2023.
Office Action from CN Application No. 202180031617.8 dated Dec. 4, 2023.
Extended European Search Report from EP Application No. 21797847.7 dated Sep. 29, 2023.
Extended European Search Report from EP Application No. 21796361.0 dated Oct. 6, 2023.
Extended European Search Report from EP Application No. 21795921.2 dated Oct. 9, 2023.
Office Action from JP Application No. 2022-565606 dated Jun. 1, 2023.
Office Action from JP Application No. 2022-565606 dated Nov. 29, 2023.
Office Action from KR Application No. 10-2022-7041608 dated Jul. 3, 2023.
Office Action from SG Application No. 11202254130W dated Sep. 15, 2023.
Office Action from IL Application No. 304507 dated Oct. 31, 2023.
EDN, "The ABCs of interleaved ADCs," https://www.edn.com/the-abcs-of-interleaved-adcs/, Feb. 17, 2013, 8 pages.
Fifield, "Stretching the Dynamic Range of ADCs—a case study," EE Times, Oct. 9, 2012, 4 pages.
Gervasoni et al., "A General Purpose Lock-In Amplifier Enabling Sub-ppm Resolution," 30th Eurosensors Conference, Eurosensors 2016, Procedia Engineering 168, 2016, pp. 1651-1654.
Ghosh et al., "Mitigating timing errors in time-interleaved ADCs: a signal conditioning approach," 2013 IEEE International Symposium on Circuits and Systems (ISCAS), 2013, 4 pages.
Kester, "ADC Architectures I: The Flash Converter," Analog Devices, MT-020 Tutorial, 2009, 15 pages.
Kumar et al., "Design and Considerations of ADC0808 as Interleaved ADCs," International Journal of Advanced Scientific and Technical Research, Issue 4, vol. 1, Jan.-Feb. 2014, 11 pages.
Lin et al., "Chapter 3: Parallel-Sampling ADC Architecture for Multi-carrier Signals," Power-Efficient High-Speed Parallel-Sampling ADCs for Broadband Multi-carrier Systems, Analog Circuits and Signal Processing, Springer International Publishing, Switzerland, 2015, 28 pages.
Manganaro et al., "Interleaving ADCs: Unraveling the Mysteries," Analog Dialogue 49-07, Jul. 2015, 5 pages.
Pollinger et al., "Control Loops for a Coupled Dark State Magnetometer," IEEE Sensors 2010 Conference, Nov. 2010, 6 pages.
Reeder et al., "Pushing the State of the Art with Multichannel A/D Converters," Analog Dialogue 39-05, May 2005, 4 pages.
Schmidt et al., "High-Speed Digital-to-Analog Converter Concepts," Proceedings of SPEI, vol. 10130, Jan. 2017, 9 pages.
Stanford Research Systems, "About Lock-In Amplifiers, Application Note #3," www.thinkSRS.com, 9 pages.
Stutt, "Low-Frequency Spectrum of Lock-in Amplifiers," Research Laboratory of Electronics, Massachusetts Institute of Technology, Technical Report No. 105, Mar. 26, 1949, 22 pages.
Wikipedia, "Lock-in amplifier," https://en.wikipedia.org/wiki/Lock-in_amplifier, downloaded on Jul. 27, 2021, 5 pages.
Zurich Instruments, "Principles of lock-in detection and the state of the art," White Paper, Nov. 2016, 10 pages.
Office Action from JP Application No. 2022-565605 dated Sep. 18, 2024.
Office Action from JP Application No. 2022-565607 dated Oct. 17, 2024.
Office Action from KR Application No. 10-2023-7043493 dated Oct. 17, 2024.
Office Action from KR Application No. 10-2022-7041610 dated Nov. 30, 2024.
Office Action from TW Application No. 112139565 dated Dec. 10, 2024.
Office Action from IL Application No. 297590 dated Dec. 26, 2024.
Office Action from IL Application No. 297747 dated Dec. 30, 2024.
Office Action from U.S. Appl. No. 18/629,072 dated Jan. 29, 2025.

* cited by examiner

1600 →

| Position | Output |
|---|---|
| 0 | 0.000 |
| 1 | 0.500 |
| 2 | 0.866 |
| 3 | 1.000 |
| 4 | 0.866 |
| 5 | 0.500 |
| 6 | 0.000 |
| 7 | -0.500 |
| 8 | -8.666 |
| 9 | -1.000 |
| 10 | -0.866 |
| 11 | -0.500 |

1700

HYBRID DIGITAL AND ANALOG SIGNAL GENERATION SYSTEMS AND METHODS

CROSS-REFERENCE TO RELATED APPLICATIONS

This application is a continuation of U.S. patent application Ser. No. 17/241,458, filed Apr. 27, 2021, which claims priority to U.S. Provisional Patent Application No. 63/016,747, filed Apr. 28, 2020, U.S. Provisional Patent Application No. 63/034,052, filed Jun. 3, 2020, and U.S. Provisional Patent Application No. 63/057,745, filed Jul. 28, 2020, each of which is incorporated herein by reference in its entirety.

This application is related to the following applications being filed concurrently, each of which is incorporated herein by reference in its entirety: U.S. patent application Ser. No. 17/241,450, to Fortney, "RANGING SYSTEMS AND METHODS FOR DECREASING TRANSITIVE EFFECTS IN MULTI-RANGE MATERIALS MEASUREMENTS," filed Apr. 27, 2021, now U.S. Pat. No. 11,550,015; and U.S. patent application Ser. No. 17/241,472, to Fortney, "INTEGRATED MEASUREMENT SYSTEMS AND METHODS FOR SYNCHRONOUS, ACCURATE MATERIALS PROPERTY MEASUREMENT," filed Apr. 27, 2021, now U.S. Pat. No. 11,762,050.

FIELD

This disclosure relates to voltage and current analog source generation, including by hybrid Alternating Current (AC) and Direct Current (DC) systems and methods. More generally, it relates to electronics, analytical instrumentation, software, and infrastructure for signal sourcing and signal measuring. The disclosure also relates to systems that measure signals for materials and device characterization and other applications under challenging experimental conditions that can cause high levels of noise and interference. In these contexts, it relates to digital-to-analog conversion and vice versa.

BACKGROUND

Materials and device property measurements (e.g., electron transport properties such as Hall, mobility and carrier concentration, etc.) are often highly sensitive to noise, interference, and stray signals. For example, superconductive properties are typically measured at extremely low temperatures (e.g., lower than 4 K) necessary for observing those properties without excessive noise. These measurements may also require very high field strength (e.g., in excess of 5 T), which can complicate experimental setups. Handling noise, interference, and stray signals under these compromising conditions is critical for obtaining reliable, accurate data.

Any noise or irregularities introduced via an input or source signal can manifest in the sample and throughout the entire measurement system. Because of this, input or source signal problems are pervasive. They degrade the measurement itself. They can also adversely affect, and be made worse by, any electronics and equipment they traverse. The best way to handle this is to generate source signals that introduce as little noise or ambiguity as possible.

Techniques such as dithering, subranging, pulse width modulation, least significant bit/most significant bit (LSB/MSB) dual digital-to-analog converter (DAC) architectures, etc. all can improve resolution and reliability. Combining stable components with low drift references, temperature-controlled elements, chopper amplifier methods, Sigma-Delta blocks, successive approximation register analog-to-digital converter (ADC) techniques, etc. can improve accuracy.

While these techniques are useful, they can be inadequate for extremely sensitive material measurements performed under compromising conditions. In particular, they have limited flexibility in addressing noise, glitches, and other ambiguities introduced into a measurement system via a source signal. Material measurement systems are often dynamic. They regularly require re-configuration and re-configuring to accommodate a variety of different kinds of measurements. Their source signal generators need to have built-in flexibility. Current systems often apply source processing (e.g., signal gain) uniformly to different and incompatible aspects of the source. Many fail to treat the DC and AC source components differently and independently. This creates problems and limits flexibly since DC and AC components often scale and range very differently.

Therefore, there is a critical need for new and improved solutions for providing robust, high quality, low noise source or output signals that can apply signal processing and gain in a flexible manner. There is a need for systems that will do this for source signals built from DC and AC components that differ substantially in range.

SUMMARY

An analog signal generating source comprising two or more digital-to-analog converters (DAC) combined to generate one or more frequency components. The analog signal source comprises a first path for generating substantially low frequency signals, the first path comprising a first one of the DACs. The analog signal source comprises a second path for generating substantially high frequency signals, the second path comprising a second one of the DACs. The analog signal source also comprises a data processor for processing an input signal and providing the processed input signal to the first and second paths. The analog signal source comprises a combining circuit configured to combine outputs of the first and second paths into the source signal. The analog signal source comprises a feedback portion configured to sense the source signal. The analog signal source comprises a servo loop configured to use the sensed source signal to adjust as need to maintain the source signal to substantially agree with the input signal.

In some embodiments, the data processor providing the processed input signal to the first and second paths comprises at least one of: feeding a DC input to the first path; feeding a low frequency input to at least one of the first path and the second path; and feeding a high frequency input to at least one of the first path and the second path. The servo loop maintaining the source signal to substantially agree with the input signal may comprise at least one of: removing DC errors; removing low frequency errors; and maintaining an integrity of the high frequency signals. A bandwidth of the feedback portion may be substantially higher than a bandwidth of the first path. The feedback portion sensing the source signal may comprise comparing the input signal to the output signal. The data processor processing an input signal may comprise at least one of: removing high frequency signals that are higher than a bandwidth of the first path but within a bandwidth of the feedback portion; and removing high frequency signals that are higher than a bandwidth of the feedback portion and higher than a bandwidth of the first path.

The first path may be configured for direct current (DC). The feedback portion may comprise at least one analog-to-digital converter (ADC). The data processor may comprise ADC feedback and the data processor processing an input signal may comprise: comparing the input signal to the source signal; and removing from the input signal high frequency signals that are higher than a bandwidth of the first path but within a bandwidth of the feedback portion. The second path may be configured to accommodate at least one of: more than one frequency and complex waveforms characterized by a plurality of frequency components. The first path may comprise an integrater. The first path may comprise a first gain configured to range the first path prior to combining with the second path. The second path may comprise a second gain configured to range the second path prior to combining with the first path. The first and second gains may be configured to operate independently of one another. The feedback portion may comprise signals from outside the signal source. The first path may comprise at least one of a dithering function, a sub-ranging function, and a pulse width modulation in series with the output of the second path. The second path may be configured to at least one of: change a DC offset of the low frequency signals faster than a low frequency response time of the servo loop; and change a DC offset of low frequency transient information faster than a low frequency response time of the servo loop.

Every device in the signal source may share the same clock. At least one of the first and second paths and the feedback portion may comprise at least one of a phase shift and a group delay. The signal source may comprise a third path for generating substantially high frequency signals, wherein the combining circuit may be configured to combine outputs of the first, second, and third paths into the source signal. The outputs of the first path, second path, and feedback portion may be accessible to a user via the data processor. The source signal may be fed to at least one of a voltage source, a current source, a power supply, a source measure unit, a temperature controller, a measurement system, and a radio frequency (RF) source. The signal source may be configured to provide an additional source signal independent of the source signal provided by the combining circuit. The source signal may control a source measure unit. The first path may be configured to add a small AC signal to at least one of a large DC signal and a low frequency ramping signal to produce the first path output. The second path may be configured to accept high frequency signals; and the first path may be configured to accept frequency information relating to the high frequency signals. The first path may comprise filtering. The second path may comprise filtering. The signal source may comprise a third path that comprises filtering. The filtering may be implemented in at least one of the first, second, and third paths after the two or more DACs. The first path may be configured to generate harmonic signals. The second path may be configured to generate harmonic signals. The signal source may comprise a third path configured to generate harmonic signals.

The signal source may be used in conjunction with at least one of a voltage source, a current source, a power supply, a source measure unit, a temperature controller, a materials parameter measurement system, and a radio frequency (RF) source. The combining circuit may be configured to combine outputs of the first and second paths into more than one source signal. The signal source may be configured to operate as a controller for a source measure unit. The combining circuit may be configured to combine outputs of the first and second paths into at least one harmonic signal.

Aspects of the present disclosure also include a method of sourcing a signal, the method comprising providing an input signal to a data processor and processing the input signal via the data processor. The method also comprises sending the processed input signal via the data processor to a first and second path, the first and second paths each comprising two or more DACs to generate two or more frequency components. The method also comprises generating, via the first path, a first path output of substantially low frequency signals; generating, via the second path, a second path output of substantially high frequency signals; combining the first and second path outputs into a source signal via a combining circuit; and sensing the source signal via a feedback portion. The method further comprises providing, via the feedback portion, the sensed source signal to a servo loop; and using the sensed source signal to maintain, via the servo loop, the source signal to substantially agree with the input signal.

DETAILED DESCRIPTION

Hybrid Sourcing
Overview

This disclosure addresses the problem of improving source signal quality with a methodology called "hybrid sourcing." Hybrid sourcing creates high quality analog source signals from both AC and DC components. It tailors gain paths for AC and DC differently to leverage the different advantages of AC and DC sourcing electronics. Its source signals have extremely low levels of noise and glitching. They have greater flexibility and range than conventional, single range sourcing. Variations of the present disclosure include hybrid sourcing using DACs, generally referred to herein as "hybrid DAC systems." These solutions are particularly useful for applications requiring low noise signals with a high degree of reproducibility and reliability. U.S. Provisional Patent Application No. 63/057,745, discusses material measurement applications of hybrid sourcing in more detail.

Hybrid DAC systems may include DACs, ADCs, filtering elements, combining means (e.g., summing elements and integrators), feedback elements, etc., among other components. A hybrid DAC may include a software-executing processor or processing means. It may also include analog hardware and/or digital hardware. Processing algorithms can precisely control operation to deliver extremely accurate output signals.

Hybrid DAC systems offer flexibility in configuring source signals for different requirements. They may control a number of properties through fine tuning components, gain, and other variables and/or selecting specific components. Configurable properties include: resolution, quantization, update rates, offset errors, gain errors, differential non-linearity errors, integral non-linearity errors, calibration errors, output noise, dynamic range, output bandwidth, source impedance, output drive capabilities, switching noise, phase errors, drifts vs. time and temperature, etc. These and other concepts are explored below.

Exemplary converter systems that may be used within the context of the present disclosure include any suitable DAC or ADC. Specific examples include DACs using an ADC (e.g., the Linear Technology 24-bit LTC2400) as a feedback element in a digitally corrected loop to realize 20-bit performance. In this variation, a DC DAC can be a slave to ADC feedback. A comparator can determine a difference between the intended and actual output of the system. A corrected code can be generated and presented to, for example, the DAC. This may correct the DAC's drifts and nonlinearity to a desired accuracy. The ADC may, in some variations, set accuracy. The may digitally sense feedback by placing the ADC at the load. These and many other ways to use the DAC (e.g., LSB/MSB sub-ranging, pulse width modulation (PWM), and high-speed integrating) are within the scope of the present disclosure.

Comparison with Non-Hybrid Sourcing

Figure 1A:
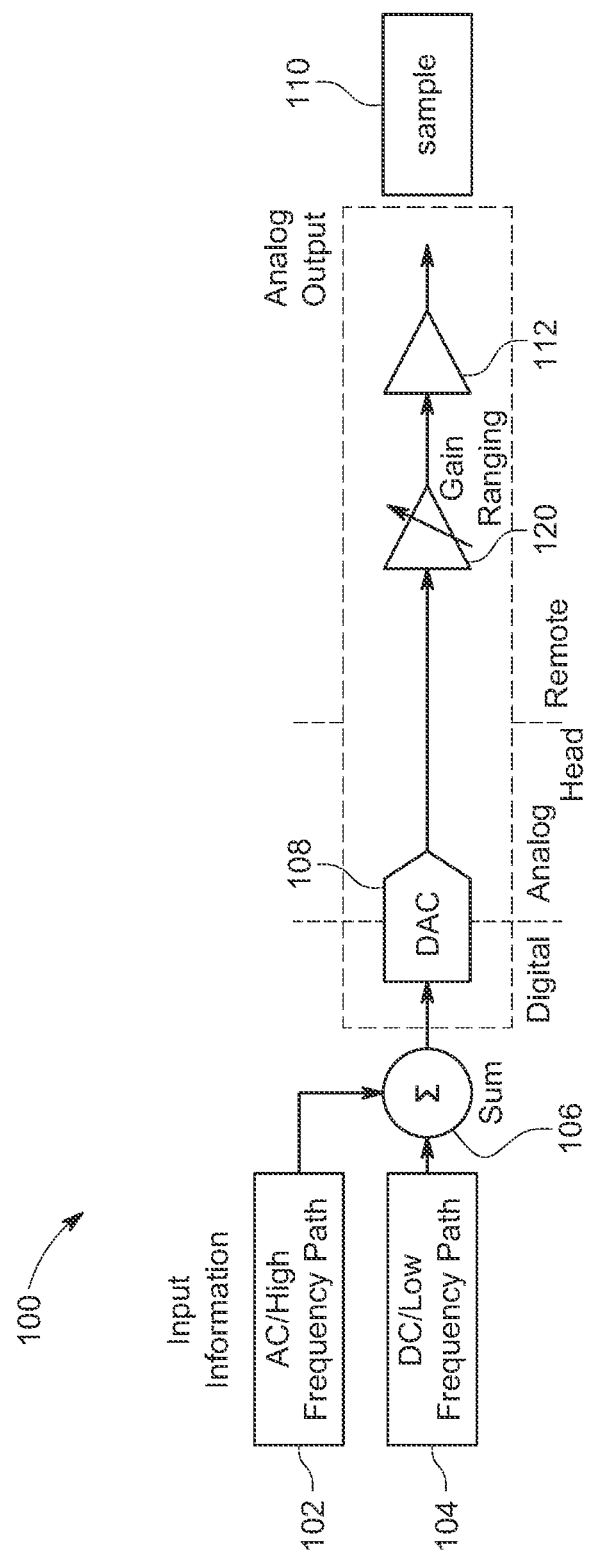
FIG. 1A illustrates a non-hybrid source signal chain 100 that applies the same gain chain to both AC and DC components.

For comparison, FIG. 1A illustrates a non-hybrid source signal chain 100 that applies the same gain chain to both AC and DC components. Herein, when describing signal sourcing, the words "chain" and "path" will be used interchangeably. Use of chain 100 is typically limited to situations where AC 102 and DC 104 inputs are generally in the same or similar range. Here, small AC signals relative to the DC signal have only a few bits of resolution. In this narrow set of circumstances, both AC and DC signals can be amplified together. However, such a single gain chain does not have flexibility. The only parameter in chain 100 with any variability is the gain of variable amplifier 120, which is applied to both AC and DC components simultaneously. Moreover, since all of the components carry both signal types, this topology prevents independent configuration of AC and DC portions of the source signal.

In chain 100, element 106 adds the AC 102 and DC 104 signals together before applying any gain. DAC 108 converts the AC/DC combined signal to analog. It then provides the combined signal to variable amplifier 120. The gain of amplifier 120 may be selected by the user. It may also be ranged automatically, and/or according to feedback from the "Analog output" signal at sample 110 (e.g., via a feedback loop (not shown)). From variable amplifier 120, the combined signal is sent to the sample 110 via second amplifier 112.

Herein the term "sample" will be used interchangeably with the phrase "device under test" (DUT)." It is to be understood that either a DUT or a "sample" may be a device or a sample of material. Often, in the context of the material measurements disclosed herein, devices (e.g., transistors) are created for the express purpose of testing a material in the created device (e.g., semiconducting materials).

FIGS. 1B-1G show the effect of a small AC signal superimposed on a larger DC signal. They show that, although the AC signal is smaller than the noise floor in these cases, it can be detectable (e.g., with a lock-in amplifier). The user can set an amplitude of the AC signal with higher resolution (e.g., sixteen bits, as opposed to two or three).

Figure 1B:
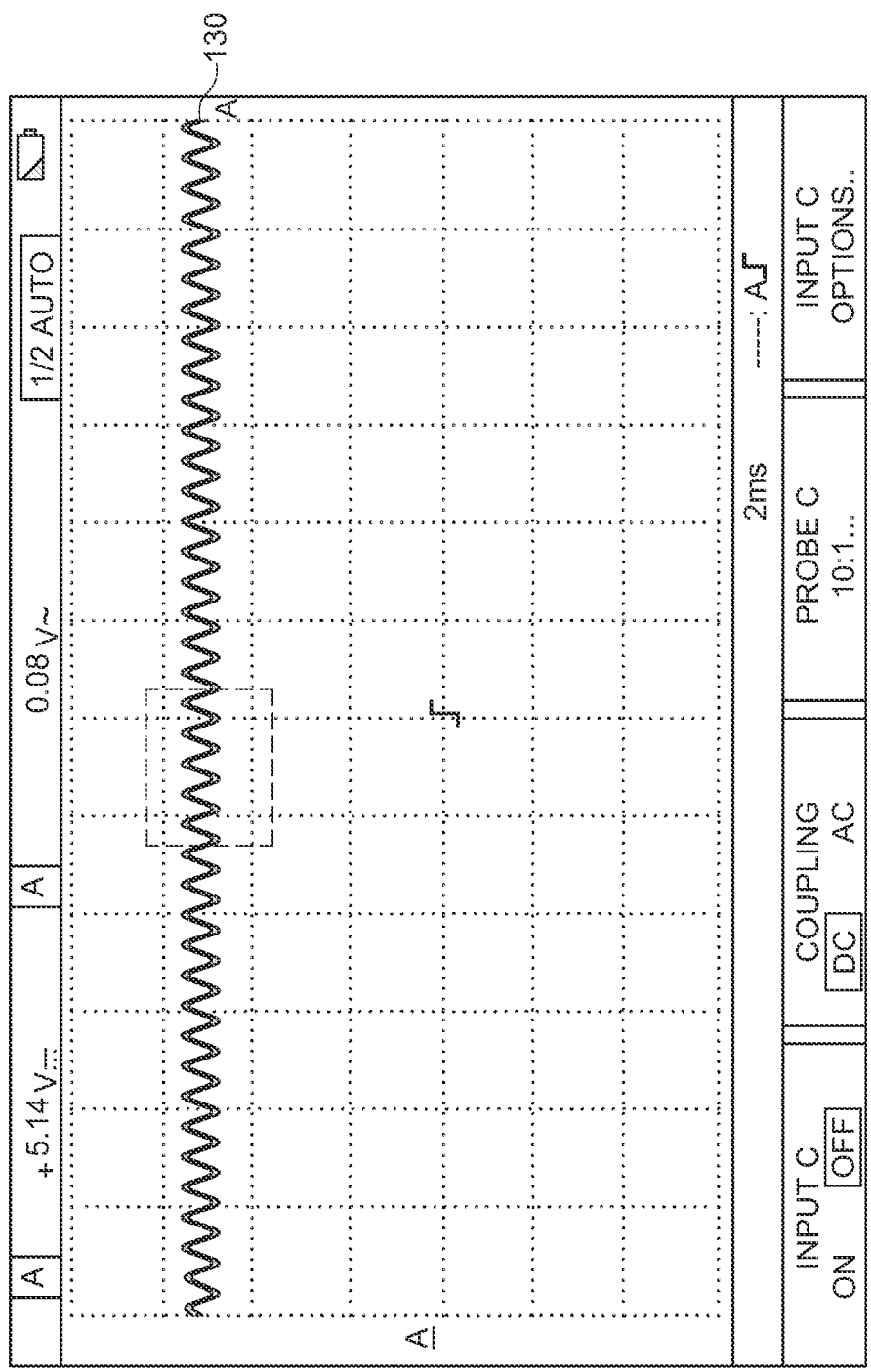
FIG. 1B shows a 100 mV AC signal superimposed on a 5V DC signal to illustrate the difficulty of configuring gain in signal chain 100 for both signals.
Figure 1C:
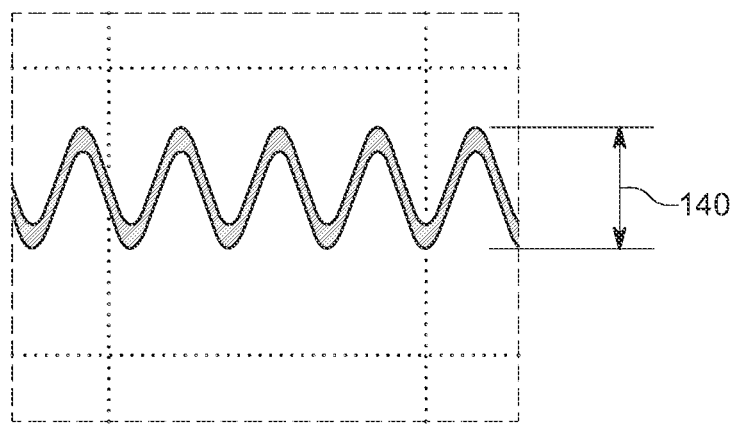
FIG. 1C is an inset of the 100 mV AC signal shown in FIG. 1B.

FIGS. 1B and 1C show the highest AC amplitude case of the three cases, a 100 mV AC sine wave 140 superimposed on a 5V DC offset 130. FIG. 1B shows several cycles of the wave 140 as measured by a digital multimeter. FIG. 1C is a blowup of a few of those cycles.

One easily sees from FIGS. 1B and 1C that the wave 140 is barely visible when superimposed on the appropriate scale for viewing the DC signal 130. Yet a large gain suitable for configuring the small AC signal 140 will also magnify errors and noise in the larger DC signal 130. At the same time, a smaller gain more appropriate for the large DC signal 130 will not adequately amplify the AC signal 140. Therefore, configuring a single gain chain (e.g., 100) to simultaneously accommodate both DC 130 and AC 140 signals will be difficult and prone to error.

Figure 1D:
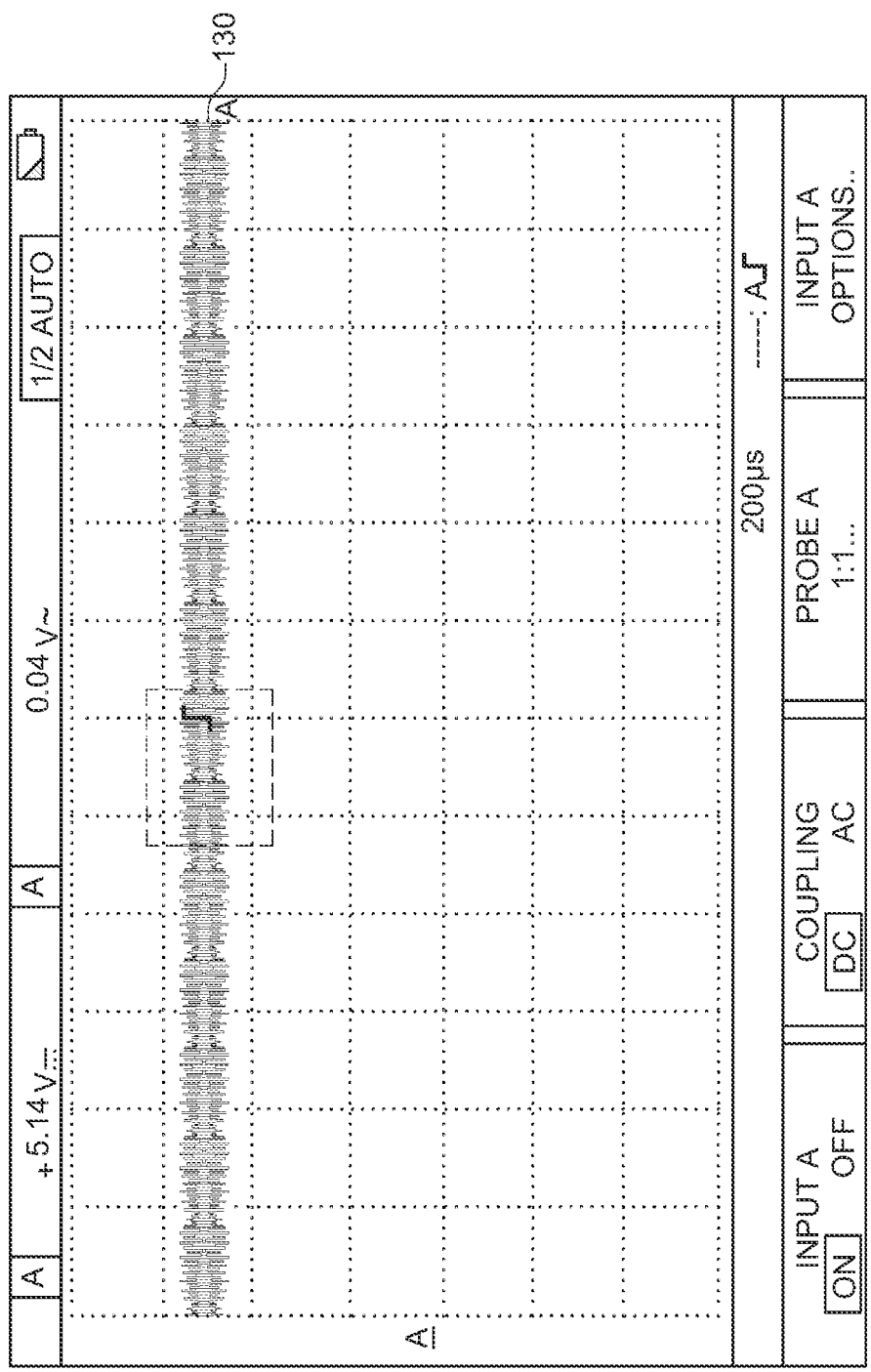
FIG. 1D shows a 1 mV AC signal superimposed on a 5V DC signal to illustrate the difficulty of configuring gain in signal chain 100 for both signals.
Figure 1E:
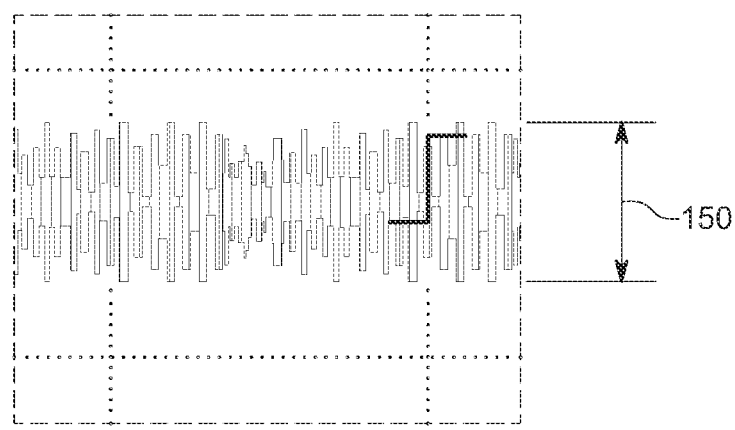
FIG. 1E is an inset of the 1 mV AC signal shown in FIG. 1D.
Figure 1F:
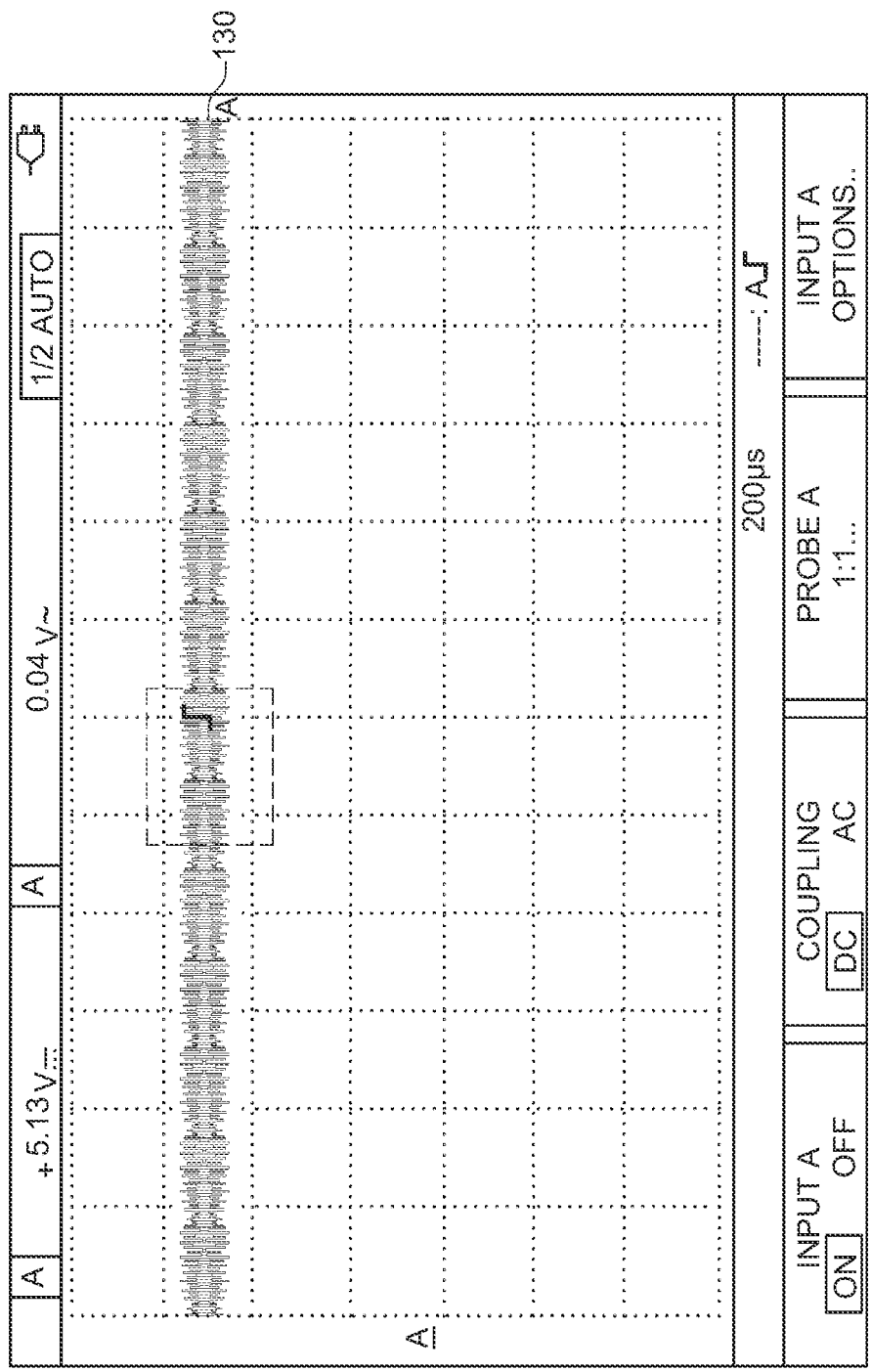
FIG. 1F shows a 100 µV AC signal superimposed on a 5V DC signal to illustrate the difficulty of configuring gain in signal chain 100 for both signals.
Figure 1G:
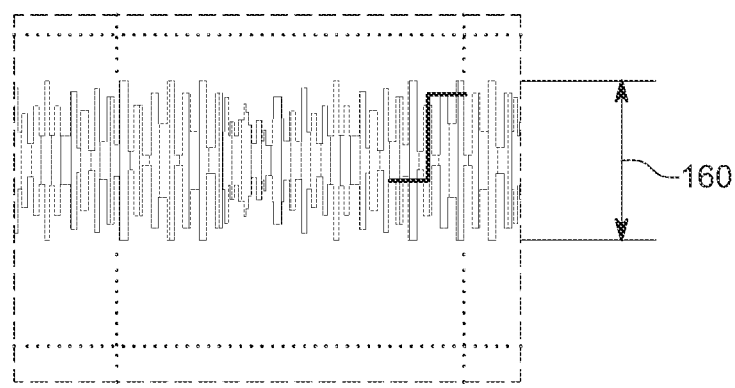
FIG. 1G is an inset of the 100 µV AC signal shown in FIG. 1F.

FIGS. 1D and 1E further illustrate the point for an AC signal 150 with an even smaller amplitude, 1 mV. AC signal 150 is superimposed on the same 5V DC offset 130. As best shown by inset FIG. 1E, the amplitude of wave 150 is imperceptible when viewed on the appropriate scale for the DC offset 130. FIGS. 1F and 1G make the same point with a still smaller 100 μV signal, a source amplitude typical in materials characterization experiments. As shown in inset FIG. 1G, the 100 μV amplitude of wave 160 is buried within and dominated by the noise of the DC offset 130 and of the instrumentation (oscilloscope). In this situation, common for material applications, ranging a single gain chain 100 to configure both signals is impractical or impossible in practice due to the resolution of practical converters.

Hybrid Source Variations

The variations that follow contrast the features and operation of exemplary hybrid signal generation systems/sources with those of non-hybrid chain 100. Hybrid systems separate low-frequency and high-frequency generation paths, allowing separate and independent configuration of each over a range of frequencies. Separate configuration simultaneously generates high-quality AC signals and highly accurate high-resolution DC signals. Combining the separately configured signals provides an analog output signal with a superior range of frequencies and reliability to those achieved using a single path (e.g., chain 100).

Figure 2:
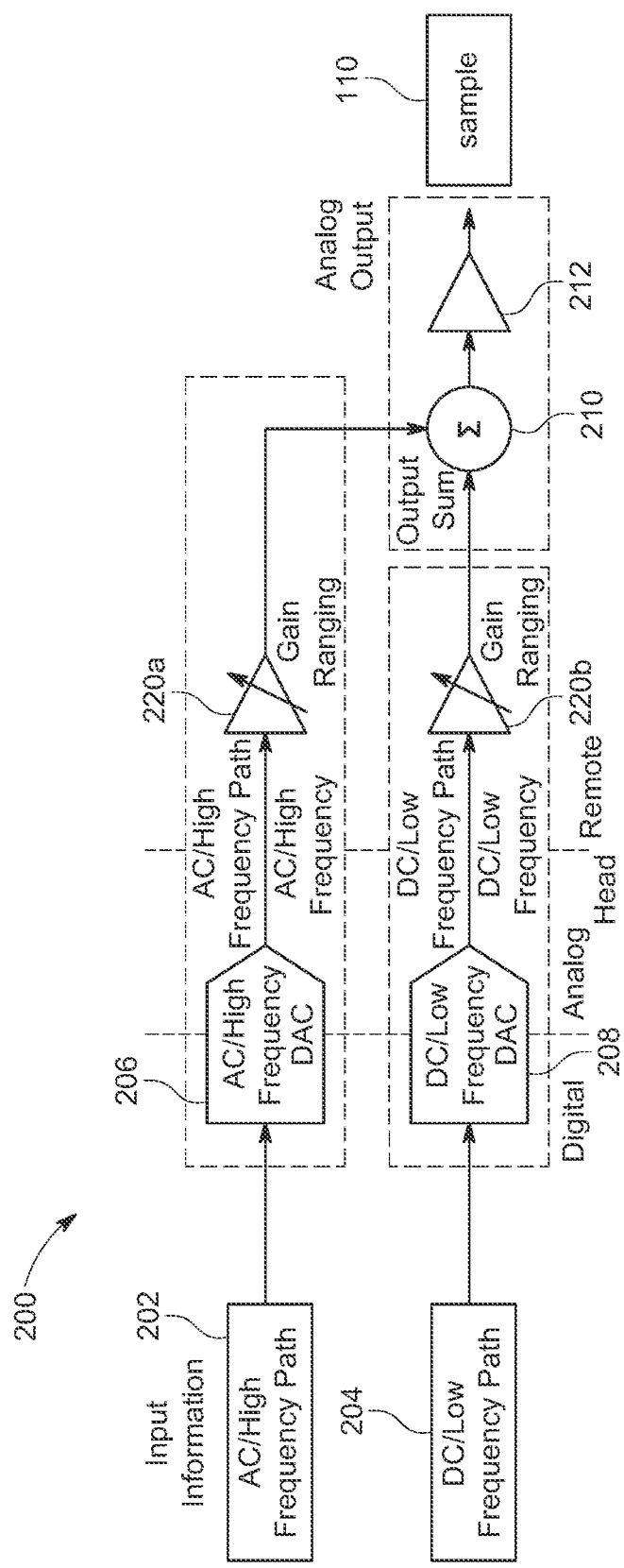
FIG. 2 illustrates a hybrid system in the form of an exemplary source signal chain 200.

FIG. 2 illustrates a relatively simple hybrid system in the form of an exemplary source signal chain 200. Chain 200 dedicates separate DACs 206 and 208 and amplifiers 220a and 220b for separately configuring AC and DC paths. The separate configuration paths are labeled in FIG. 2 as "AC/High Frequency Path" and "DC/Low Frequency Path," respectively. Element 210 sums the outputs of both paths and sends them to amplifier 212. After amplification, the Analog Output signal is routed to sample 110.

More specifically, chain 200 feeds AC input 202 to the "AC/High Frequency Path." That path first converts the signal using DACs 206, then amplifies it using variable gain 220a. Separately, DC input 204 is fed to the "DC/Low Frequency Path." That path converts the signal using DAC 208, then amplifies it using variable gain 220b. Both paths are summed at 210, then provided to sample 110 via amplifier 212. Variable gains 220a and 220b may be set by ranges and other settings, or by user preference, protocol, or may be pre-set. Separate ranging is particularly important for hybrid generation techniques. The high frequency AC generation containing separate ranging allows a hybrid DAC to create small AC signals riding on large DC outputs (see, e.g., FIGS. 1B-1G).

Figure 3:
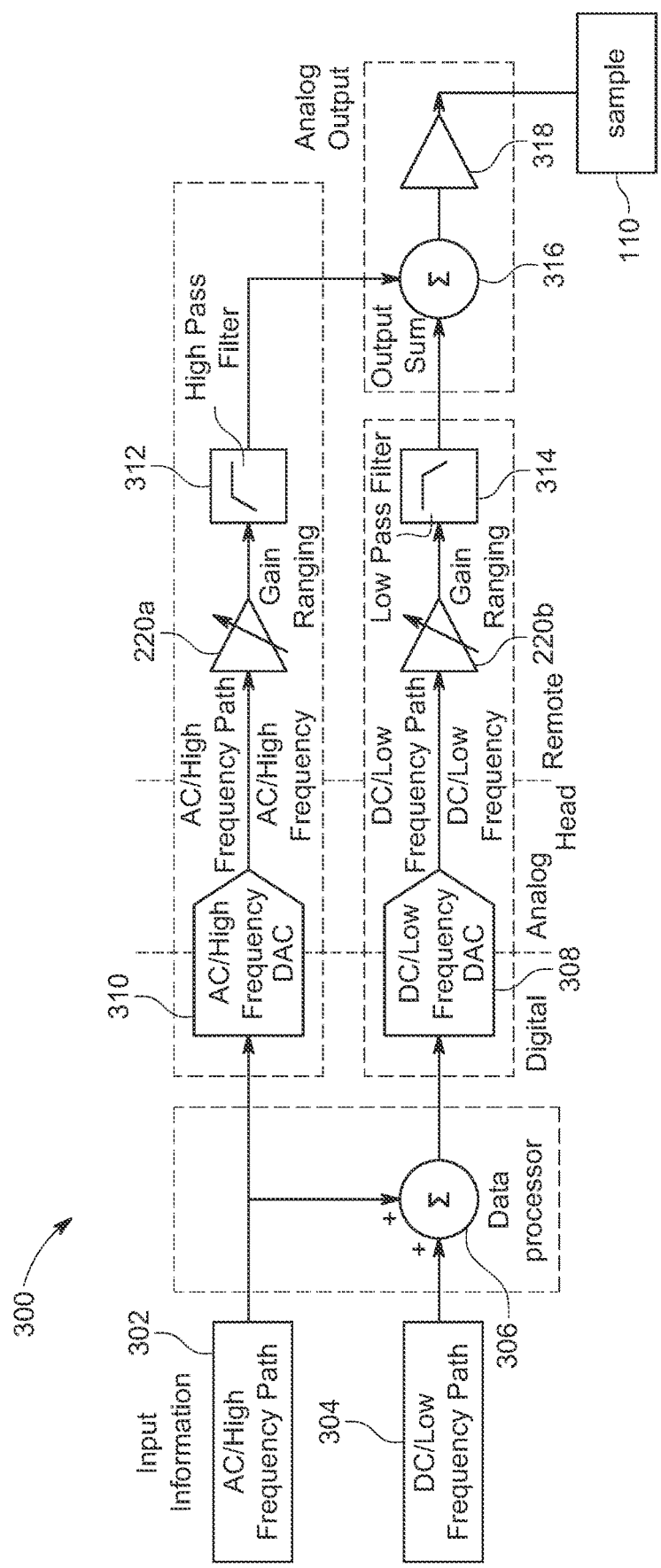
FIG. 3 illustrates another exemplary source signal chain 300 where the AC circuit is prevented from affecting the accuracy of the DC circuit.

FIG. 3 illustrates another exemplary source signal chain 300 where AC and DC configurations are separate and parallel. Chain 300 prevents the AC path ("AC/High Frequency Path") from affecting the accuracy of the DC path ("DC/Low Frequency Path") by including the AC input 302 in the configuration of the DC contribution to the Analog Output signal. Chain 300 can accomplish reasonable accuracy while using less circuitry (i.e., fewer components than more complicated variations) than many hybrid systems.

More specifically, as shown in FIG. 3, chain 300 sends a summation of the AC 302 and DC 304 inputs at 306 to the DAC 308 in the DC/Low Frequency Path. It concurrently routes the AC 302 input to the DAC 310 in the AC/High Frequency Path. Chain 300 then amplifies both the AC signal and a composite DC/AC signal by a variable amplifier (220a and 220b, respectively). Gains 220a and 220b for the DC and AC circuits are different and can be configured for each. They may be set in the same manner described above for gains 220a and 220b in the context of FIG. 2.

Next, the AC Configuration signal is high pass filtered 312 to remove low frequency components. The DC Configuration signal is low pass filtered 314 to remove high frequency components. The filtered AC and DC signals are then summed at 316. The summed signal is amplified at 318 and sent to the sample 110.

Chain 300 allows parallel configuration of the AC DAC 310 and the DC DAC 308, their associated path components, along with facilitating the separate ranging capability in each path (e.g., to address ranging issues shown in FIGS. 1B-1G). It removes DC errors from the AC generation path and vice versa, via filters 312 and 314. Specifically, high pass filter/AC 312 removes DC/low frequencies from the AC/High Frequency Path. In other words, DC errors that may be generated by the AC DAC 310 and amplifier 220a are eliminated by filter 312 so they do not affect the DC output performance in the Analog Output signal. Low pas filter/DC 314 similarly removes AC errors from the DC/Low Frequency path.

Chain 300's addition of the AC (high frequencies) to the DC/Low Frequency Path at 306 allows the separate AC and DC paths to be configured and then combined at the output.

However, frequency limitations of AC/High Frequency Path and DC/Low Frequency Path of chain 300 can influence overall performance. Variability and/or drift in the crossover frequencies of filters 312 and 314 can cause frequency errors due to initial component tolerances, temperature drifts, and drifts that occur over time. These effects may cause the bandwidths of AC and DC paths to differ substantially from filter transition frequencies providing a flat frequency response at sample 110. Output can lower significantly when parasitic or inherent frequency performance of the paths approaches the transition frequencies of the filters 312 and 314.

Selecting filter 312 and 314 (primary) poles and their secondary characteristics can create a relatively flat output spectrum from DC to high frequencies. Filters 312 and 314, and more particularly their respective transition frequencies and poles, should be chosen with these considerations in mind.

Figure 4:
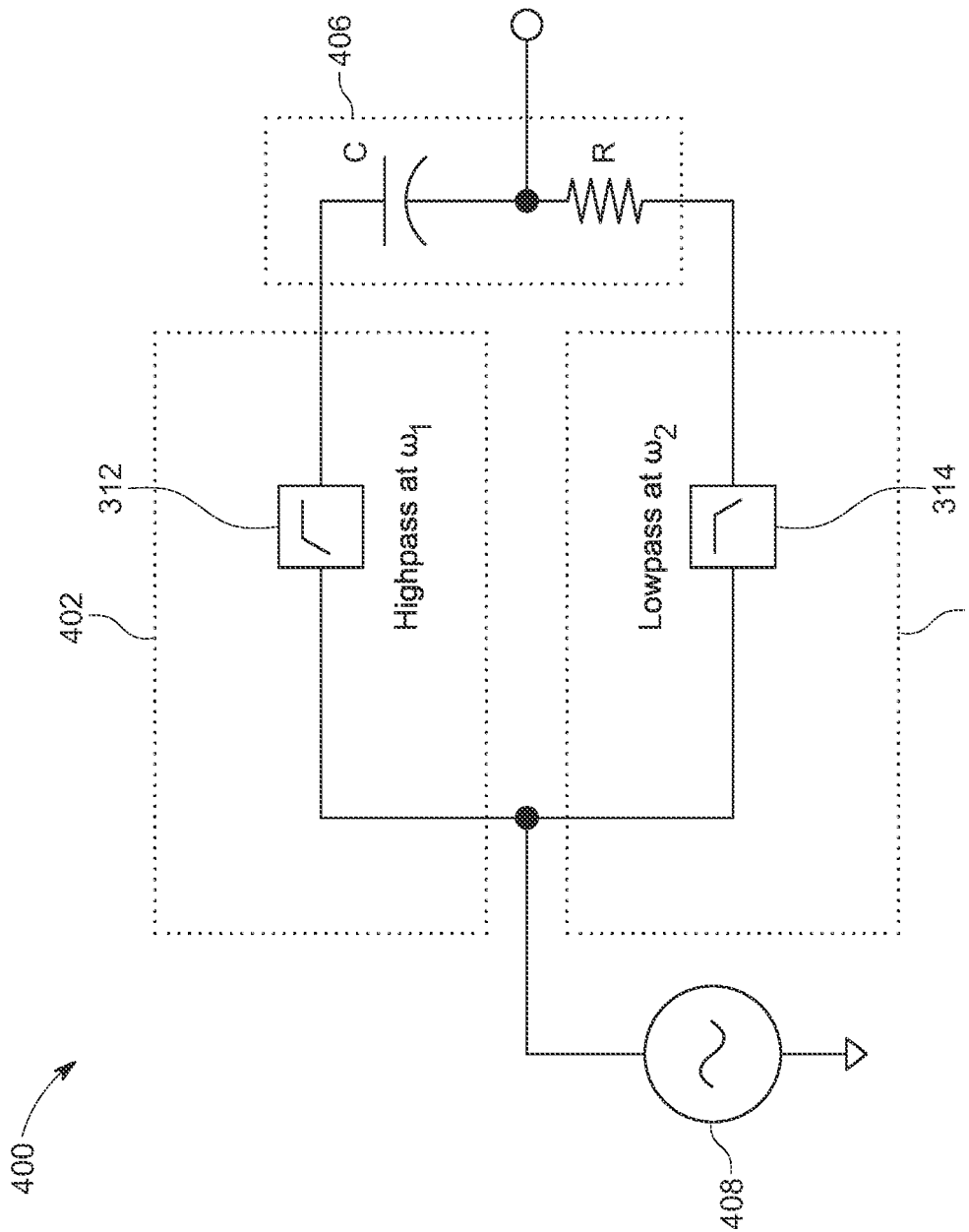
FIG. 4 is an exemplary circuit 400 that illustrates filter configuration considerations for signal chain 300.
Figure 5:
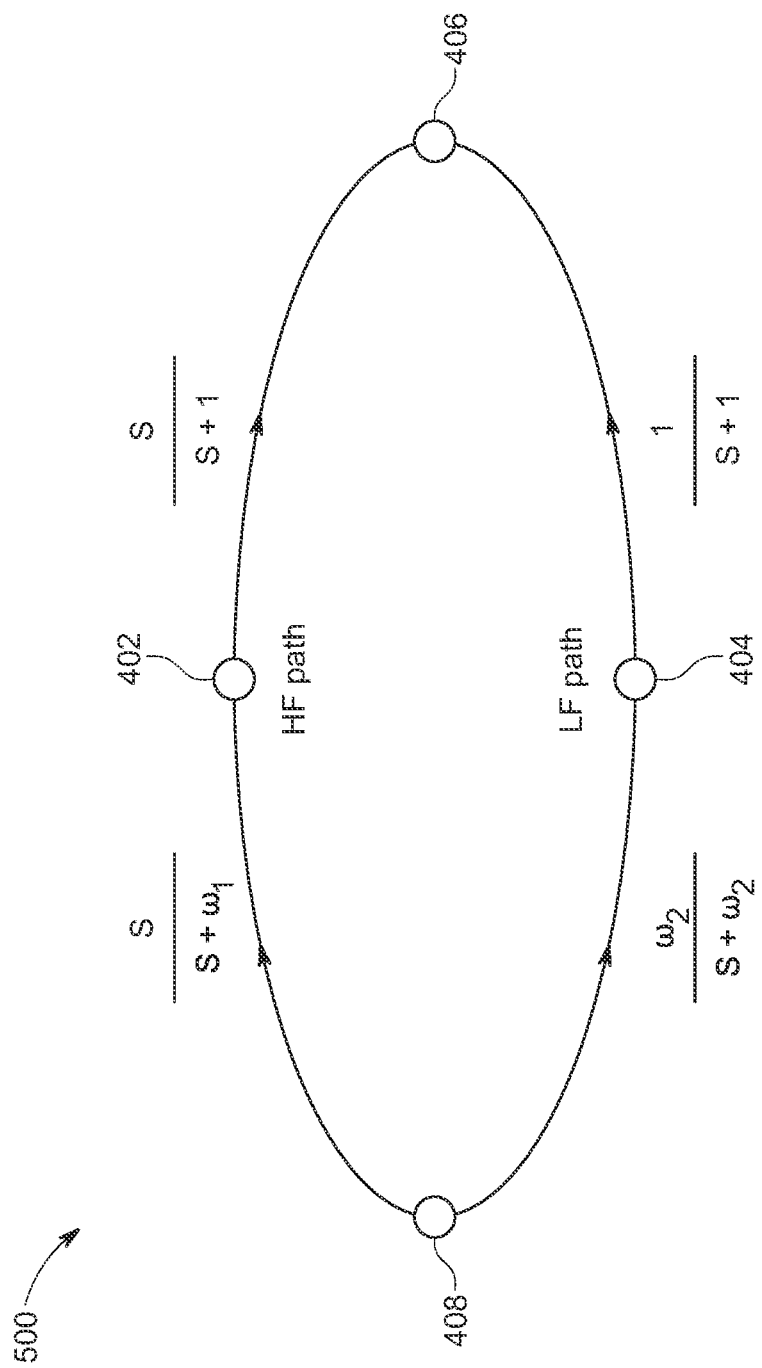
FIG. 5 is a signal flow graph 500 that represents circuit 400.

FIGS. 4-12 help explore these filter considerations. FIG. 4 shows an exemplary circuit 400 that illustrates filter considerations for chain 300. High frequency signals traverse the upper path 402. Low frequencies traverse the lower path 404. High and low frequency signals are combined by the series RC circuit 406. Note that other circuits than the RC circuit 406 may also provide recombination. Element 408 is an AC signal source. FIG. 5 is a signal flow graph 500 that represents circuit 400. To simply presentation, the values in FIG. 5 are normalized.

FIGS. 6-12 explore effects of the transition frequencies of the high pass filter 312 and low pass filter 314 in 400 changes the frequency response of the circuit. They show how a flat frequency response in system 300 may not be achieved for some practical values of these frequencies. In particular, different variations 600-1200 based on different transition frequencies of filters 312 and 314 exhibit dramatically different frequency performance. They show how changes in filters 312 and 314 can tailor the frequency performance of chain 300.

Figure 6:
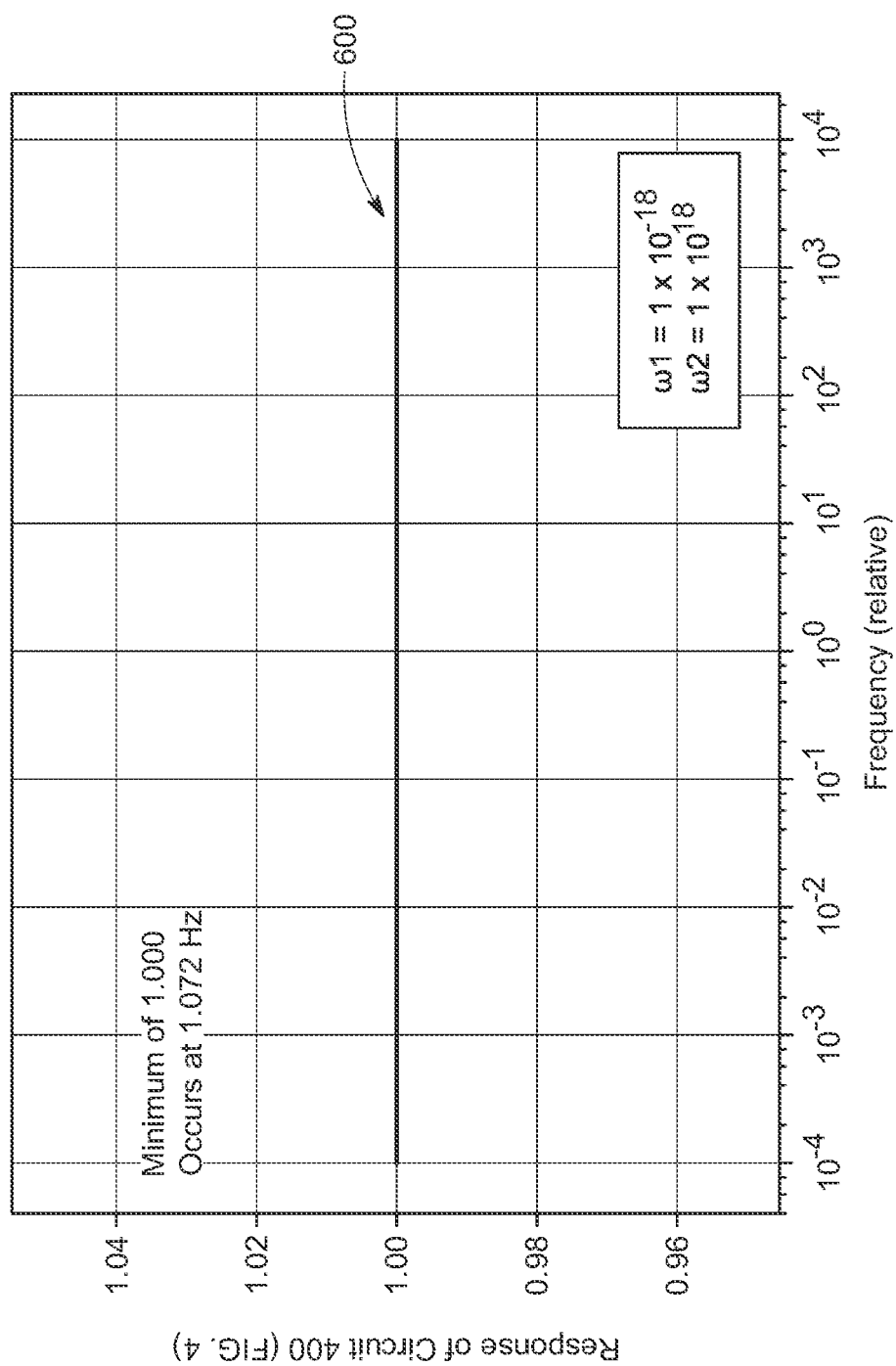
FIG. 6 shows the response 600 of circuit 400 when the transition frequency of the high pass filter 312 is small and the transition frequency of the low pass filter 314 is large.

FIG. 6 shows an extreme frequency response 600 of circuit 400 in which ω1 and ω2 are so far away from a normalized frequency that there is no perceptible dip in the frequency response. In variation 600, the transition frequency ω1 of the high pass filter 312 is small ($1 \times 10^{-18}$ in relative units) and the transition frequency ω2 of the low pass filter 314 is large ($1 \times 10^{18}$ in relative units). These conditions effectively remove filters 312 and 314 from circuit 400. They set a low enough transition for the high pass filter 312 that it passes essentially all frequencies. They also set a high enough transition for the low pass filter 314 so that it also passes essentially all frequencies. As shown in FIG. 6, the response 600 of circuit 400 under these conditions does not vary with frequency.

Figure 7:
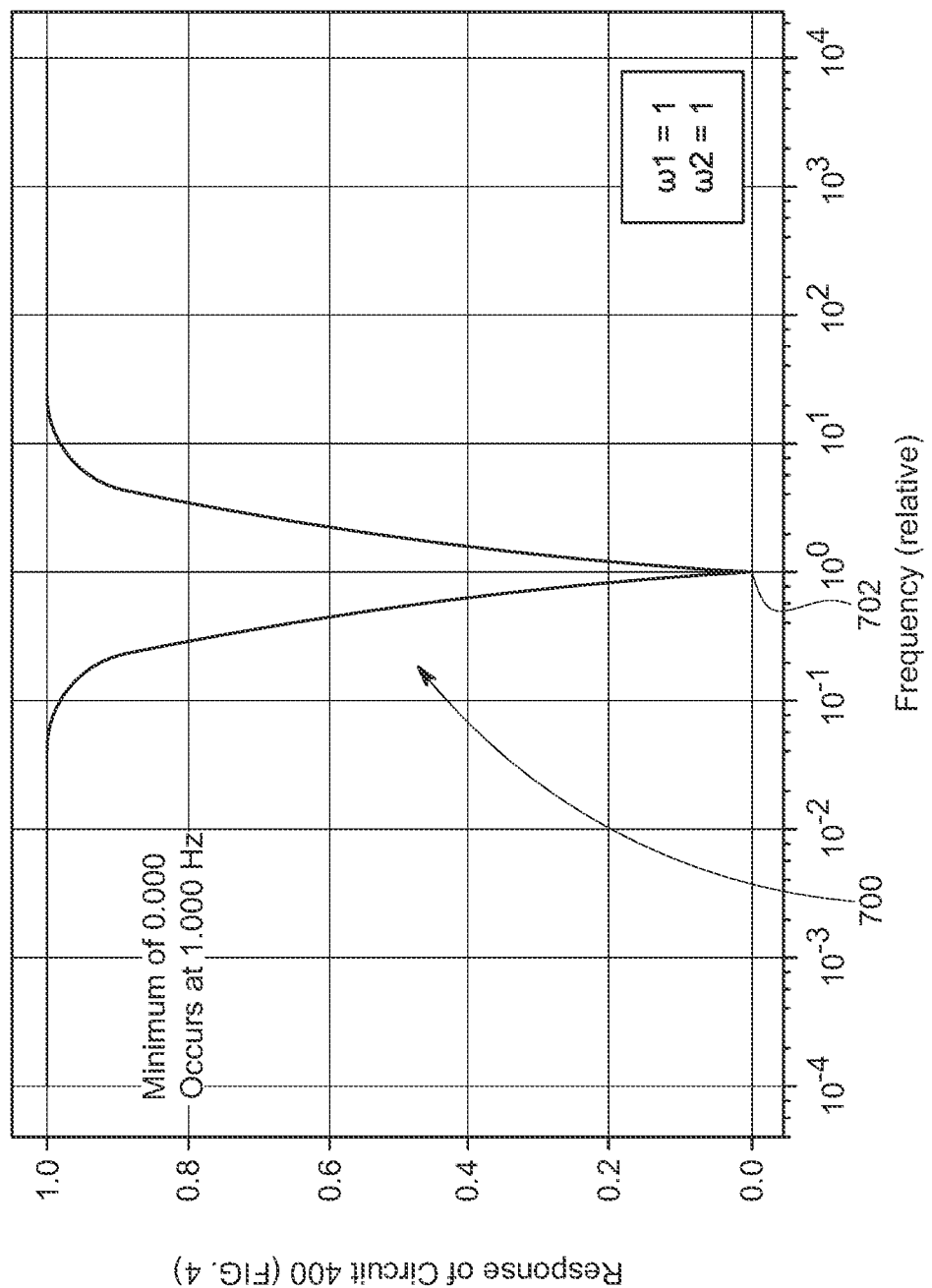
FIG. 7 shows the response 700 of circuit 400 when the transition frequency of the high pass filter 312 and the transition frequency of the low pass filter 314 are both equal to one.

FIG. 7 shows another extreme case 700. In 700, the transition frequency of the high pass filter 312 and the transition frequency of the low pass filter 314 are both equal to one. In this configuration, the secondary and primary filter poles of both filters 312 and 314 are coincident. The arrangement is often called a buffered twin-tee filter. The overall response is a "notch" 702 at 1 Hz.

Figure 8:
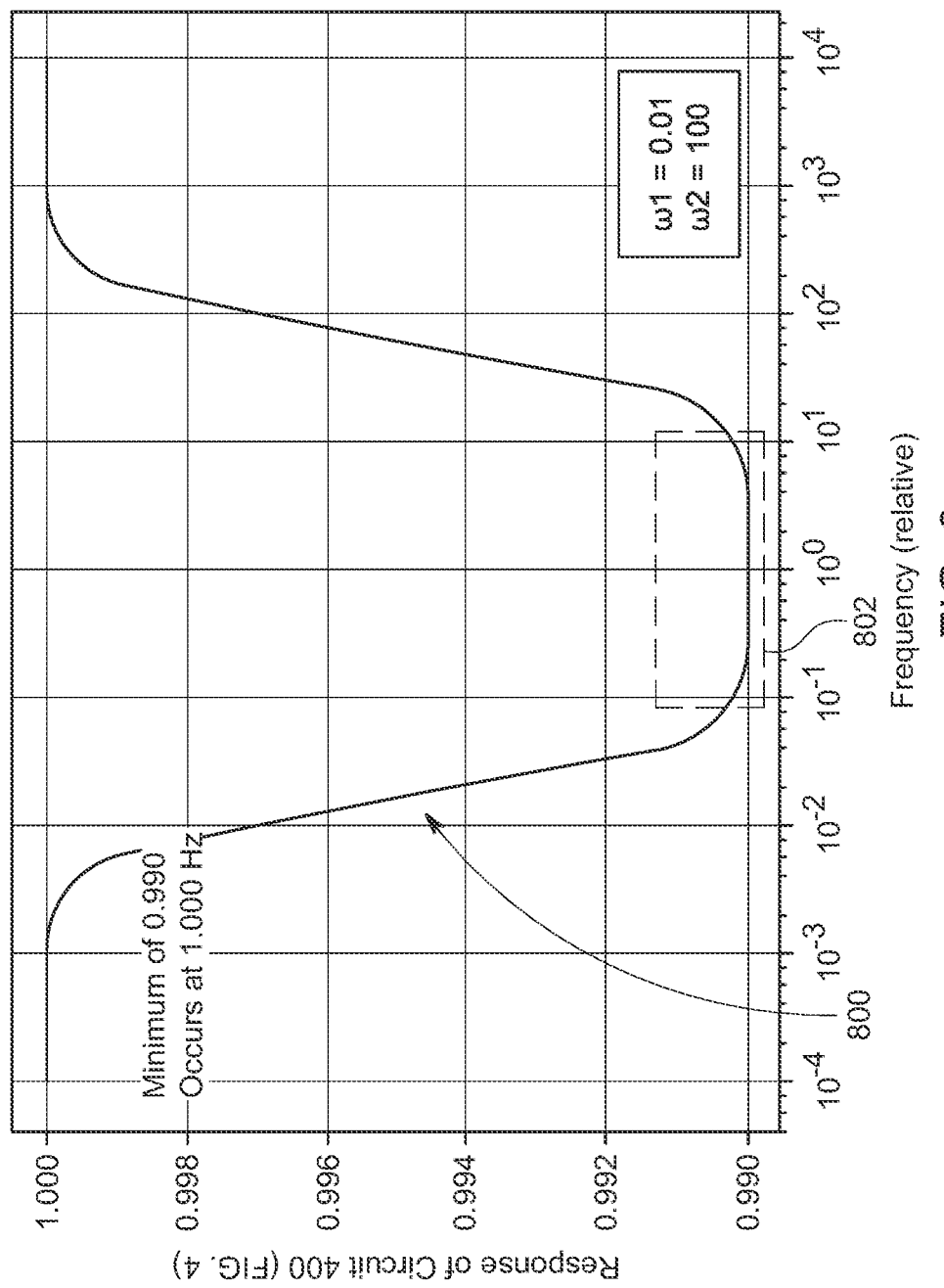
FIG. 8 shows the response 800 of circuit 400 when the transition frequency of the high pass filter 312 is 0.01 and the transition frequency of the low pass filter 314 is 100.
Figure 9:
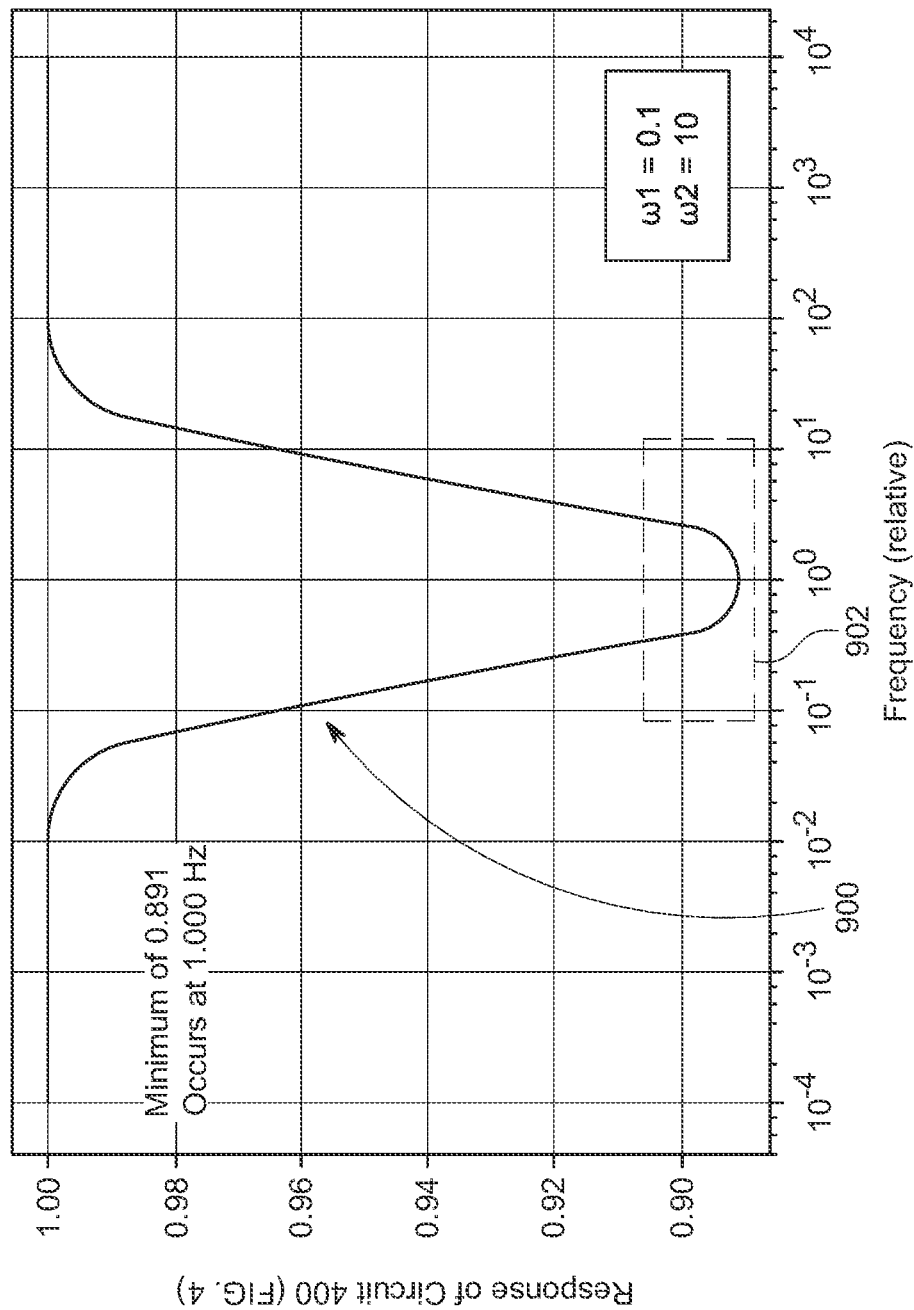
FIG. 9 shows the response 900 of circuit 400 when the secondary poles of filters 312 and 314 are each a factor of 100 displaced from the primary poles.

FIGS. 8 and 9 show intermediate cases. FIG. 8 shows the response 800 of circuit 400 when the transition frequency ω1 of the high pass filter 312 is 0.01 and the transition frequency ω2 of the low pass filter 314 is 100. In this configuration, the secondary poles of each of the two filters 312 and 314 are displaced from their primary poles by a factor of 10. This turns the narrow notch 702 of 700 into a broader "valley" 802 that extends over two decades in frequency. The depth is approximately 1% of maximum. FIG. 9, in contrast, shows the response 900 when the secondary poles of filters 312 and 314 are each a factor of 100 displaced from the primary poles. This happens with the transition frequency ω1 of filter 312 is 0.1 and that ω2 of filter 314 is 10. As shown in FIG. 9, the response 800 exhibits a valley 902 with depth approximately 10% and width approximately 4 decades in frequency. In each case in FIGS. 7-9, the frequency response is symmetrical about 1 Hz.

Figure 10:
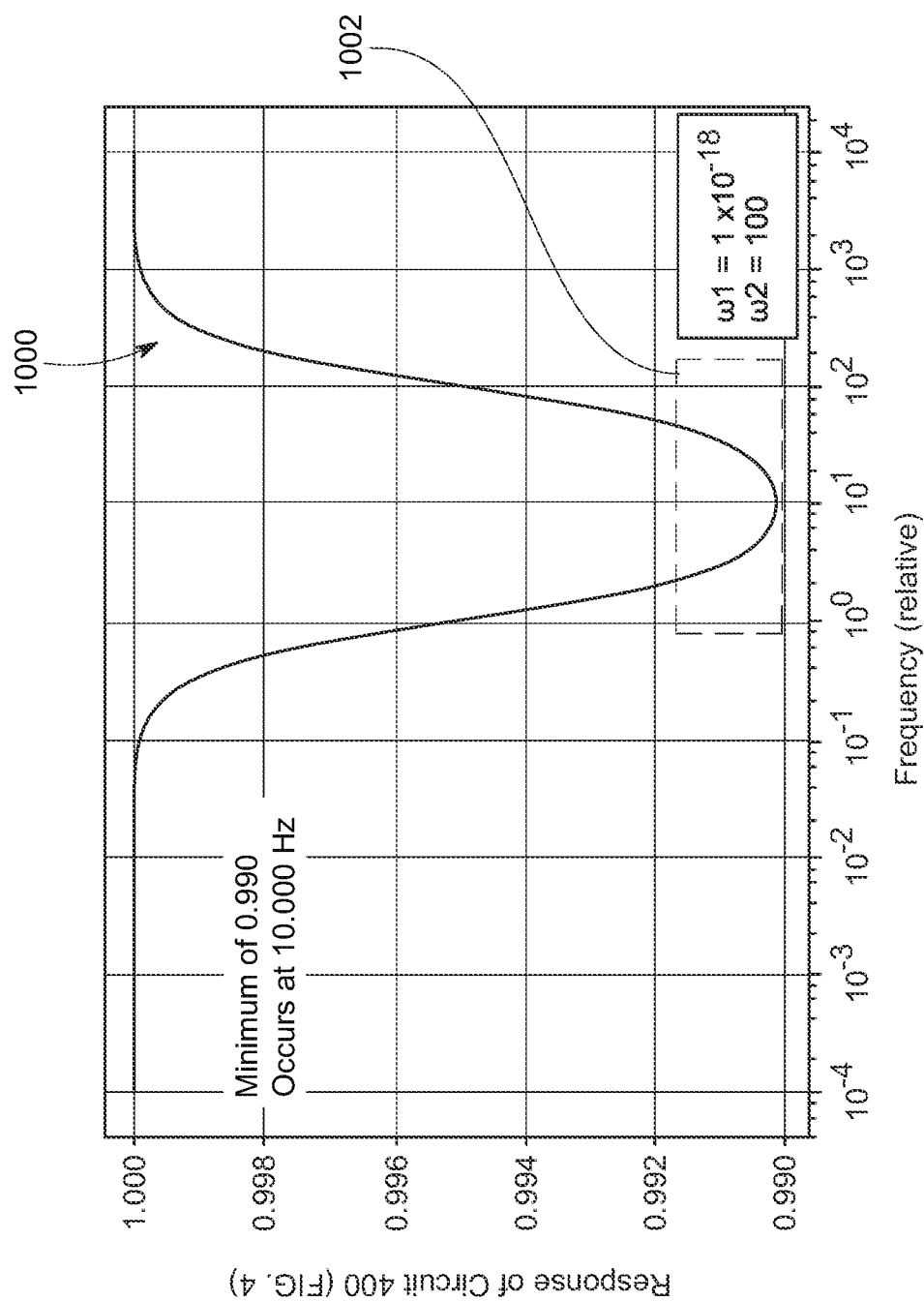
FIG. 10 shows the response 1000 of circuit 400 when the low-frequency secondary pole is displaced by a factor of 100, and the high-frequency secondary pole is omitted.
Figure 11:
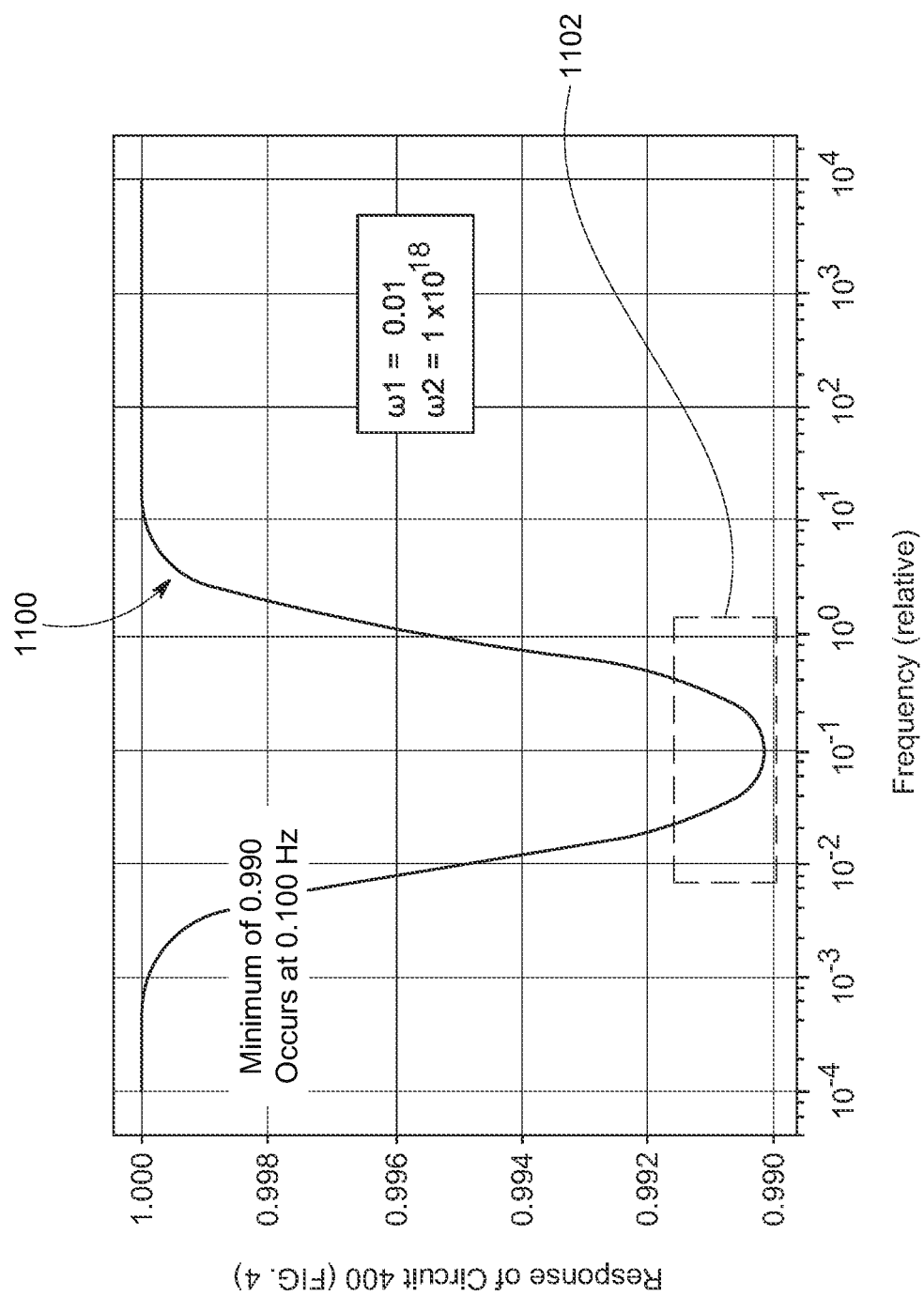
FIG. 11 shows the response 1100 of circuit 400 when the high-frequency secondary pole is displaced by a factor of 100 and the low-frequency secondary pole is omitted.

FIGS. 10 and 11 show cases where the response is offset from 1 Hz centering. Specifically, FIG. 10 shows the response of circuit 400 when the low-frequency secondary pole is displaced by a factor of 100, and the high-frequency secondary pole is essentially omitted. This happens with the transition frequency ω1 of filter 312 is $1 \times 10^{-18}$ and that ω2 of filter 314 is 100. The response 1000 exhibits a valley 1002 centered at 10 Hz, with depth approximately 1%. The width of valley 1002 spans approximately 2 decades in frequency. FIG. 11 shows the response 1100 of circuit 400 when the high-frequency secondary pole is displaced by a factor of 100 and the low-frequency secondary pole is omitted. This happens with the transition frequency ω1 of filter 312 is 0.01 and that ω2 of filter 314 is $1 \times 10^{-18}$. The response 1100 exhibits a valley 1102 centered at 0.1 Hz, with depth approximately 1% and width approximately 2 decades in frequency.

Figure 12:
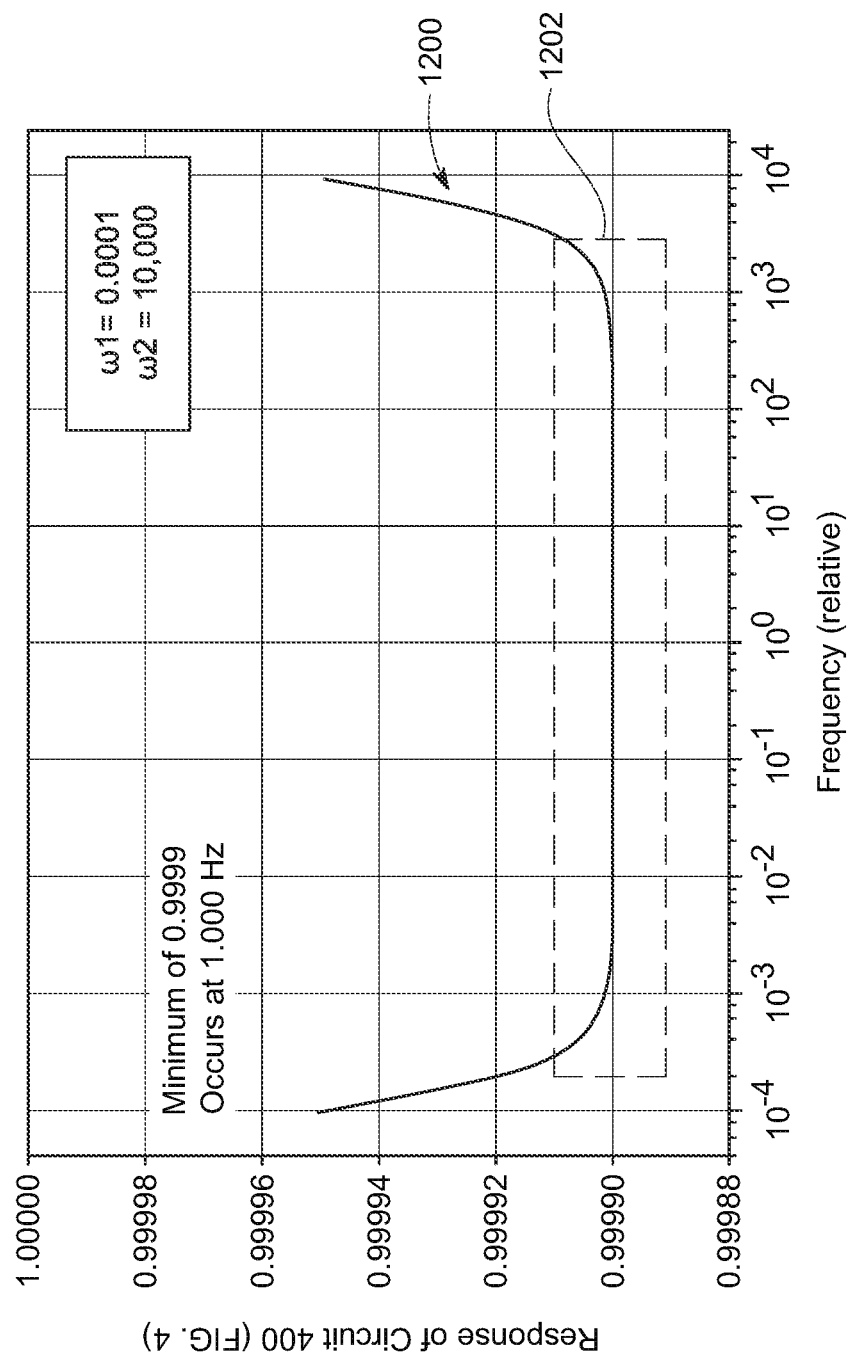
FIG. 12 shows the response 1200 of circuit 400 when the secondary poles of both filters 312 and 314 are displaced by a factor of $1 \times 10^{-4}$.

The variations in circuit 400 represented by 600-1100 show that the secondary poles of filters 312 and 314 can be substantially displaced to minimize the valley at the crossover. For example, displacing the secondary poles by a factor of $1 \times 10^{-4}$ (corresponding to a transition frequency ω1 of filter 312 of 0.0001 and a transition frequency ω2 of filter 314 of 10,000) results in a valley 1202 of depth $1 \times 10^{-4}$ and width $1 \times 10^{8}$, as shown in FIG. 12. In applications where the dual-path approach includes a negative feedback loop (e.g., a chopper-stabilized operational amplifier), valley 1202 may be of little consequence and displacements of a factor of ten, or a hundred, etc. can suffice. In variations, valley 1202 may be eliminated using secondary transfer functions that are more complex than the single pole assumed in 600-1200.

Figure 13:
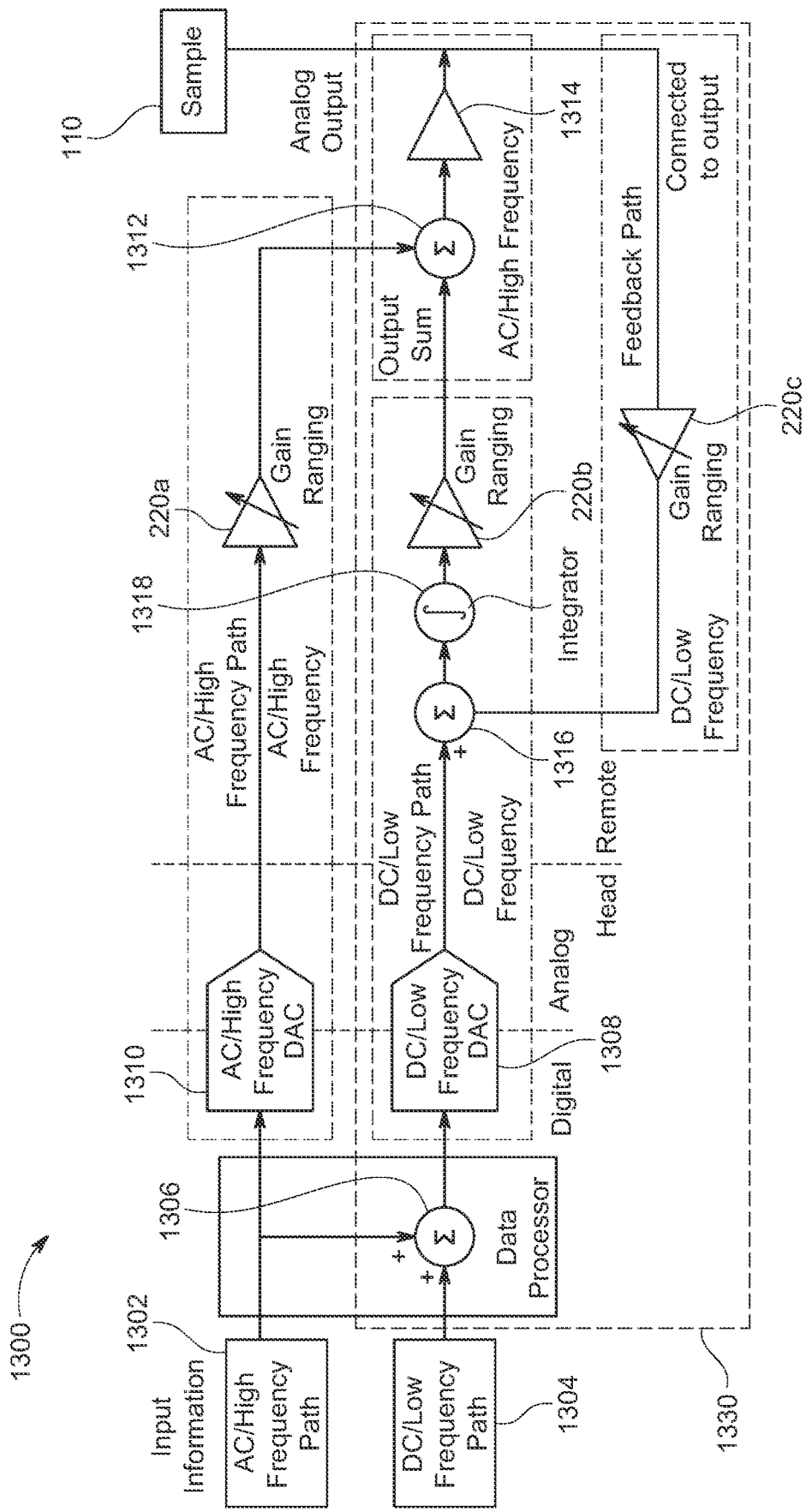
FIG. 13 illustrates an exemplary source signal chain 1300 having a DC feedback loop.

FIG. 13 illustrates another exemplary hybrid DAC source signal chain 1300 having a DC feedback loop. The DC feedback loop can correct for errors in the Analog Output signal. It can maintain separate the AC and DC paths while allowing for a flat response from high frequencies response down to DC.

In chain 1300, AC and DC inputs 1302 and 1304, respectively, are summed 1306 and sent to the DC Configuration path via DAC 1308. The AC input 1302 is fed to the AC Configuration path via DAC 1310. The AC Configuration path then passes through a variable amplifier 220a before it is summed 1312 with the signal from the DC Configuration path, after it has been amplified by 220b. Gains 220a and 220b may be set, as discussed above, in the context of FIGS. 9 and 10. The sum 1312 is then fed via amplifier 1314 and to sample 130.

DC feedback is accomplished as follows. The DC Configuration path from DAC 1308 is summed 1316 with the DC input signal after DAC 1308 processing, then to variable amplifier 220c via 1318. Gain 220c may be set as discussed above for 220a and 220b. Subsequently, the DC Configuration signal is summed at 1312 with the AC Configuration signal. This feedback loop essentially treats the AC path as a disturbance to the DC path, allowing for a flat frequency output to sample 130.

In chain 1300, the AC/high frequency path and the DC/low frequency path are separate and allow for component configuration and separate path ranging. The DC/low frequency path of 1300 can be configured (e.g., via DAC 1308 and/or gain 220b) for DC. In particular, DAC 1308 can be configured with low DC offsets. In addition, output summing element 1312 can be chosen to reduce DC errors in the output to amplifier 1314 and the ultimate Analog Output to sample 110. Also, the feedback elements (i.e., amplifier 220 and sum 1316) can be chosen with low DC offsets and low drifts with temperature and time.

These adjustments can remove the non-linear aspects of the frequency response shown in FIGS. 7-11. The Feedback Path in 1300 can remove the valley 1201 in response 1200 (FIG. 12). The Feedback Path can also compensate for negative effects on DC performance caused by other portions of the chain 1300. For example, it can compensate for DC offset errors, such as those emanating from components such as amplifier 1314, AC path DAC 1310, and amplifier 220a, among other components. Combining the AC and DC paths with a Feedback Path where the AC path is a disturbance for the DC path (see addition of AC and DC signals at 1306, which is sent to the DC path) can allow for nearly seamless transitions between ranging and other variations in the measurement system. Additionally, it can introduce feedback lines that only respond to low frequency (e.g., DC configured).

DC/low frequency path components are generally less configured for bandwidth performance as compared to components designed for AC. This encompasses most of the components in the DC/low frequency "servo loop" 1330, which refers to the DC DAC and feedback mechanism (i.e., the loop 1330 encompassed by elements 1304, 1306, 1308, 1316, 1318, 220b, 1312, 1314, 220c, and 1316 in chain 1300). This typically means that the DC/low frequency servo loop 1330 can effectively respond to frequencies only up to a specified frequency limit. Above that limit, spurious offsets, lags, errors, and other problems can manifest. Below it, the DC/Low Frequency path can handle the signal with relatively little problem. Chain 1300 sends all frequencies to the DC/Low Frequency path via 1306, which adds together the AC 1302 and DC 1304 inputs. The Feedback Path can subtract output frequencies from the DC/low frequency path after DAC 1308. The DC/low frequency servo loop 1330 can adjust the Analog Output signal until the Feedback Path and the DC DAC 1308 output are equal. Changes in the Analog Output can be continuously compensated, configuring DC/low frequency output.

In chain 1300, the servo loop 1330 may have a limited bandwidth. The loop 1330 will not affect frequencies outside of that bandwidth. In this case, the bandwidth of the Feedback Path and the DC/low frequency DAC 1308 output response may need to be significantly higher than that of the servo loop 1330. The feedback signal and DC/low frequency DAC can be designed to remove high frequencies before being sent to the rest of the DC/low frequency path. This can prevent the servo loop 1330 from removing small amounts of the high frequency signals, which could cause errors. Frequencies fed to the AC/High Frequency Path can be summed directly at 1312 into the output after the servo loop 1330. Frequencies higher than the Feedback Path's bandwidth are not fed back to the input through the feedback path and are not affected by the servo loop 1330.

The DC and low frequency performance of chain 1300 can be defined by the DC/low frequency DAC 1308, the Feedback Loop's subtracting element 1316, feedback gain element 220c, along with DC parasitic errors. These DC parasitic errors can include thermoelectric errors, low frequency crosstalk, loop parasitic capacitance, among others. Proper layout of the circuit board where 1300 is mounted (e.g., printed circuit board (PCB)) layout can reduce such DC parasitic errors.

The improved DC/low frequency performance of chain 1300 can be achieved for low frequency signals generated by either the AC/high frequency DAC 1310 or the DC/low frequency DAC 1308. The signals can be summed into the servo loop's 1330 input at 1306 and fed back through the Feedback Path. This can allow the servo loop 1330 to configure these signals. Because frequencies generated above the servo loop's 1330 frequency response are not affected, this maintains the AC/high frequency's performance characteristics.

There are advantages to producing low frequency signals in either the AC and DC path. Although frequencies above the servo loop's 1330 bandwidth need to be sourced through the AC/High Frequency Path, low frequency signals can be sourced through either path (or both simultaneously). Generating all frequencies in the AC/high frequency path may be advantageous, especially for signals with a consistent amplitude. In this case, AC gain performance can be held constant across the system's bandwidth. Ranging in this mode also can allow small amplitude AC signals to be generated in either path. This allows generation superposition of small AC signals on DC (or low frequency AC) offsets. This technique can create accurate, high resolution ramps with signals having very small AC frequencies riding on the ramps.

Separately ranging AC and low frequency signals, as in chain 1300, can be helpful in other scenarios. For example, separate ranging can assist in generating source signals for harmonic measurements with dual frequencies. Accurately generating signals with harmonic frequencies can greatly improve accuracy, reliability, and reproducibility of materials characterization measurements.

Generating low frequency signals via the DC/Low Frequency Path in chain 1300 can also be advantageous. The DC/Low Frequency Path can generate very fine resolution signals without ranging because the servo loop's 1330 feedback path dominates its performance characteristics. Doing so in combination with loop 1330 integration can produce accurate high-resolution signals. Ranging can provide additional improvements in resolution or noise at the potential expense of range changing errors. Chain 1300's architecture also facilitates increasing the DC/low frequency path's resolution. Chain 1300 uses an integrator 1318, in part, for this purpose. Variations include other methods such as dithering DACs, pulsed width modulation, etc.

Figure 14:
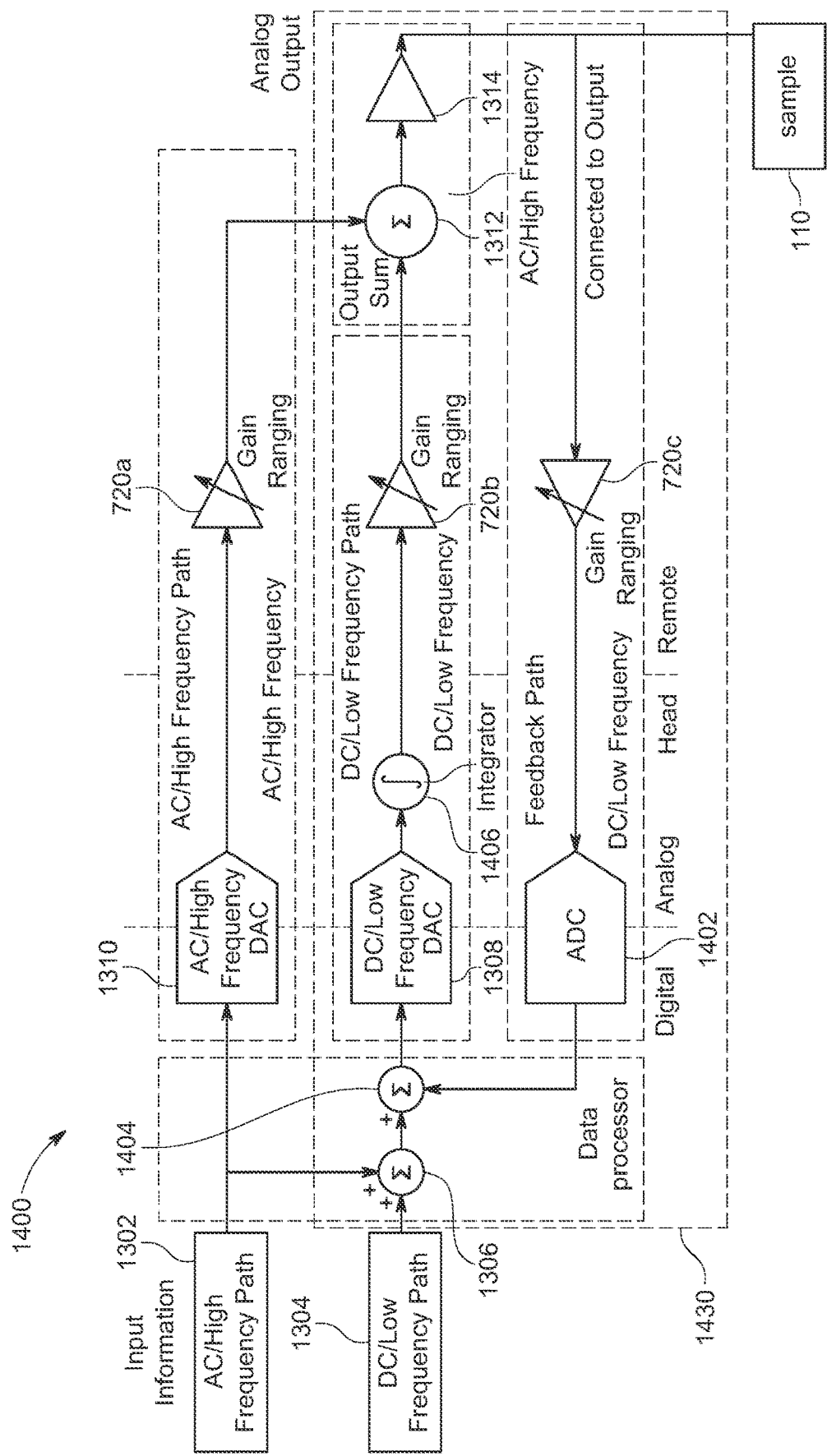
FIG. 14 illustrates another exemplary source signal chain 1400 where the DC feedback is digitized feedback using an ADC.

FIG. 14 shows another exemplary source signal chain 1400. In 1400, the DC feedback is digitized using an ADC. This brings feedback configuration to the above-described hybrid techniques. It introduces less DC inaccuracy and enhances the DC DAC resolution. It leverages the fact that ADCs are typically more accurate and offer better control than DACs.

The AC/High Frequency Path in chain 1400 is identical to that in chain 1300 in FIG. 13. The DC/Low Frequency Path of chain 1400 differs from that of chain 1300 primarily by including ADC 1402 in DC feedback, as part of its servo loop 1430. However, there are some other subtle differences. Specifically, DC feedback from the sample 110 is fed via variable amplifier 720c to ADC 1402 where it is converted to an analog signal. That signal is then summed 1404 with DC the combined DC input/AC input signal from 1306. Subsequently, the combined signal is fed to DAC 1308, via 1406, amplifier 720b and then summed with the AC Configured signal at 1312. Gains 720a, 720b, and 720c can all be set as described above with respect to FIG. 13.

The ADC 1402 feedback in chain 1400 can provide better accuracy and resolution because the best performing low frequency ADCs can have better performance than DACs. The Feedback Path in 1400 is also combined in the digital realm (i.e., with 1404). This can reduce errors from analog combination. Digitizing feedback can allow creation of complex waveforms that would be extremely difficult to generate with analog feedback. The digital feedback can also enhance the DC DAC's 1308 resolution. Since the accuracy is determined by the ADC feedback path, this allows use of a low-quality, inexpensive DAC 1308. The DC DAC's 1308 accuracy does not affect the Analog Output signal accuracy. The integrator 1406 in the DC/Low Frequency Path also enhances the resolution of the path's resolution. Since the resolution and accuracy are primarily achieved through the Feedback Path, averaging a high bit ADC 1402 with good linearity and noise can readily increase the overall resolution to well below the system's noise specifications.

The improved accuracy of chain 1400 also allows feeding the Analog Output signal back from remote locations. The Feedback Path in chain 1400 can remove many errors and offsets that occur in cabling and interconnections.

Chains 1300 and 1400 can improve transient response. Quickly changing DC signals can be processed in the digital domain. Sharp changes in the DC signal can be sent to the AC/High Frequency Path. Since the AC/High Frequency Path can change its output quickly, a large spike in the DC signal can be anticipated. The signal can be processed to make a large, fast transient occur in the AC path. Once the DC signal has reached its new level, the servo loops 1330/ 1430 can servo the DC signal again. This technique allows for fast changes, quick settling time, keeps the full resolution of the DC integrator, and keeps the accuracy of the DC loop.

Chains 200, 300, 1300 and 1400 all are shown with two generating paths, DC/Low Frequency and AC/High Frequency. However, it should be understood that more than two generating paths are possible and may be advantageous. Three or more generating paths may, for example, handle increased signaling bandwidth. They can add more DACs to the signal processing to improve accuracy. Generating very high frequencies and combining the outputs can provide high quality outputs with wide bandwidths.

Digital Source Synthesis

Variations of the disclosed systems can create source signals using direct digital synthesis. Direct digital signal gives greater consistency and control over the source signal. A digital signal also tends to have less interference and noise. Since these issues ultimately result in noise or ambiguity in the output signal, using direct digital synthesis can improve the accuracy and reproducibility of measurements. Although certain specific examples are described below, it is to be understood that any suitable mechanism for providing a digital source signal may be used in conjunction with any of the variations described herein.

Figure 15:
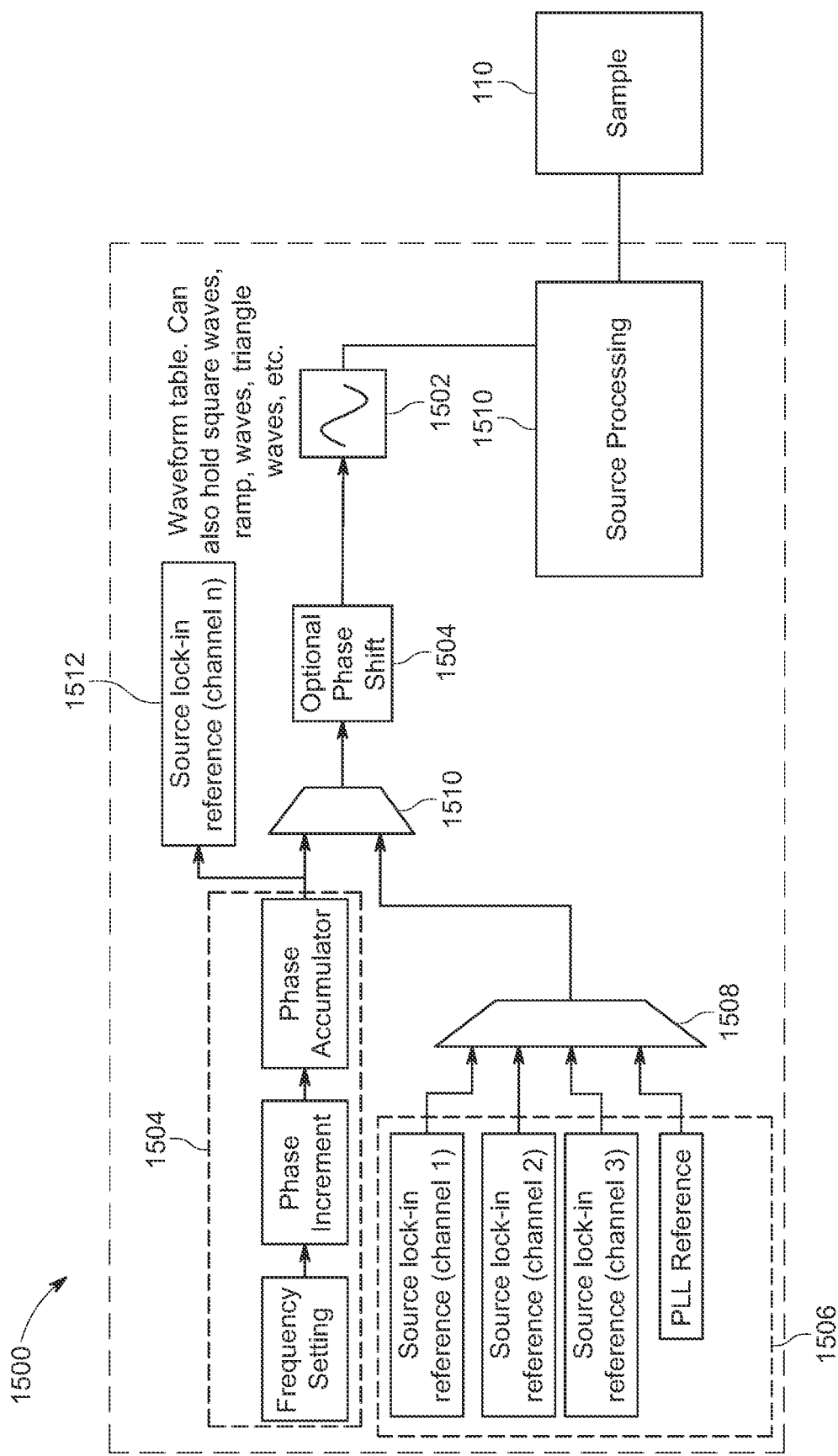
FIG. 15 illustrates one exemplary variation of a digitally synthesized source channel 1500.

FIG. 15 illustrates one exemplary variation of a digitally synthesized source channel 1500. Digitally synthesized source channel 1500 may provide analog signal inputs 102, 202, 302, 1302, and 1402 above. Source Processing 1502 shown in FIG. 15 may include any of the signal chains disclosed herein, including chains 200, 300, 1300 and 1400.

The source may be principally derived from a waveform table 1502. Table 1502 can be an algorithm (software or firmware) that generates the waveform based on inputs 1504. Inputs 1504 may direct the table 1502 to select the particular wave form to source. Inputs 1504 may select frequency, phase shift, and lag, among other things. Each of inputs 1504 is not necessarily used in every variation. They may be stored locally, may be input directly by the user, may be generated by other software and/or according to measurement or diagnostic protocols.

Reference signals 1506 may also be input to table 1502. References 1506 include source references from lock-in amplifiers (e.g., source lock-in references from channels 1-3) and phase-locked loop (PLL) reference. References 1506 may be selected by mux 1508 and sent to multiplexer (mux) 1510 where they are combined with wave form settings 1504 and additional references 1516. References 1506 may be chosen by the user, other software and/or according to measurement or diagnostic protocols. They are then sent to the table 1502 for selection of the specific waveform to output as a source signal. An output waveform from the table 1502 may then be further processed 1502 by any signal processing method described herein and provided to the source pod 104. Channel 1500 can also use a lock-in reference with optional phase shift 1504, rather than be chosen directly via inputs 1504. In this case, the source's frequency and phase can be determined by a lock-in reference signal (e.g., reference 1512). Optional phase shift 1504 can set the phase relationship with the reference 1512. The external phase relationship can be configured differently for each channel.

Figures 16, 17:
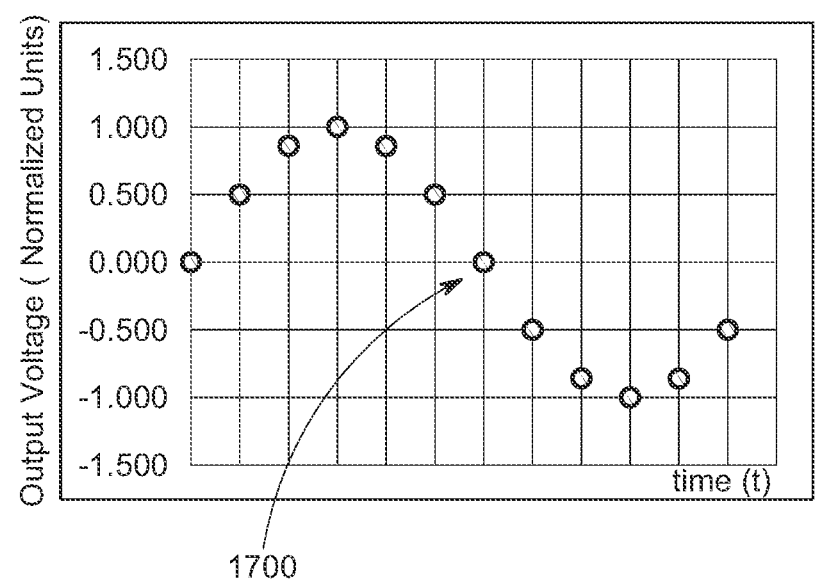
FIG. 16 shows an exemplary variation of a source wave table 1600 that can be used in conjunction with digital source channel 1500 within the context of the present disclosure.
FIG. 17 is a waveform 1700 generated by plotting source wave table 1600 that can be used in conjunction with digital source channel 1500 within the context of the present disclosure.

FIGS. 16 and 17 show an exemplary variation of a source wave table 1600 that can be provided by element 1502 of digital source 1500. Waveform 1700 in FIG. 17 is generated by plotting the data in table 1600. FIG. 17 plots a single period of waveform 1700 in relative units.

In one variation, a source signal supply algorithm can repetitively increment through the table 1600 representing one or more periods of a waveform. The table 1600 provides waveform amplitude (Output) vs. time (Position), both in normalized units. Using normalized units is not a requirement. It is convenient for scaling either the voltage or time dependence of the waveform based on inputs 1304. In this way, the table 1600 determines the waveform 1700's shape. The rate at which the algorithm cycles through the table 1600, called the phase increment (element 1504, FIG. 15), determines the waveform 1700's frequency.

The "Position" of the table 1600 need not change by an integer. In certain variations, for example, a higher resolution phase accumulator (element 1504, FIG. 15) can be used to keep track of waveform 1700's phase. The phase accumulator 1504 can increment by non-integer amounts to translate this phase into a Position in the table 1600.

Figure 18A:
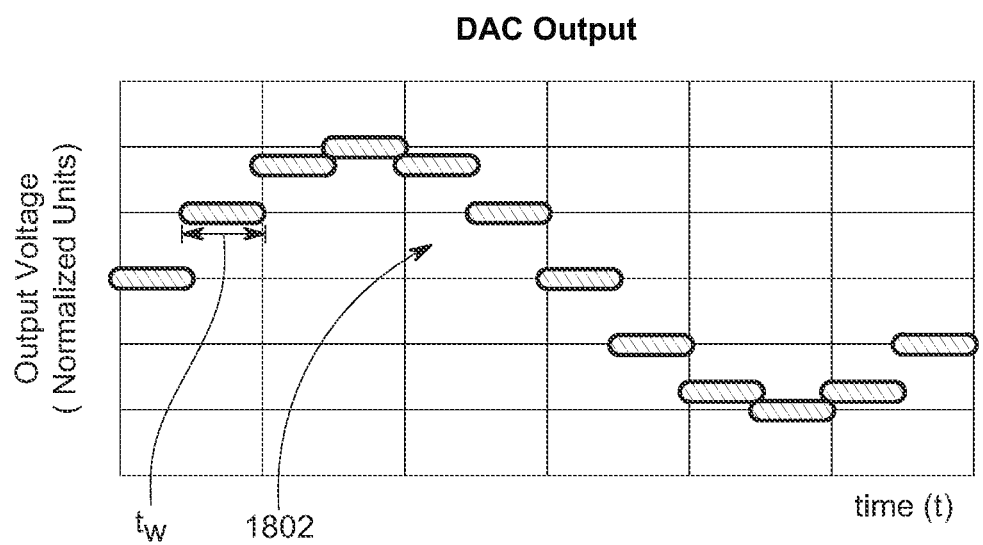
FIG. 18A shows a stepped waveform from low pass filtering the waveform in FIG. 17.
Figure 18B:
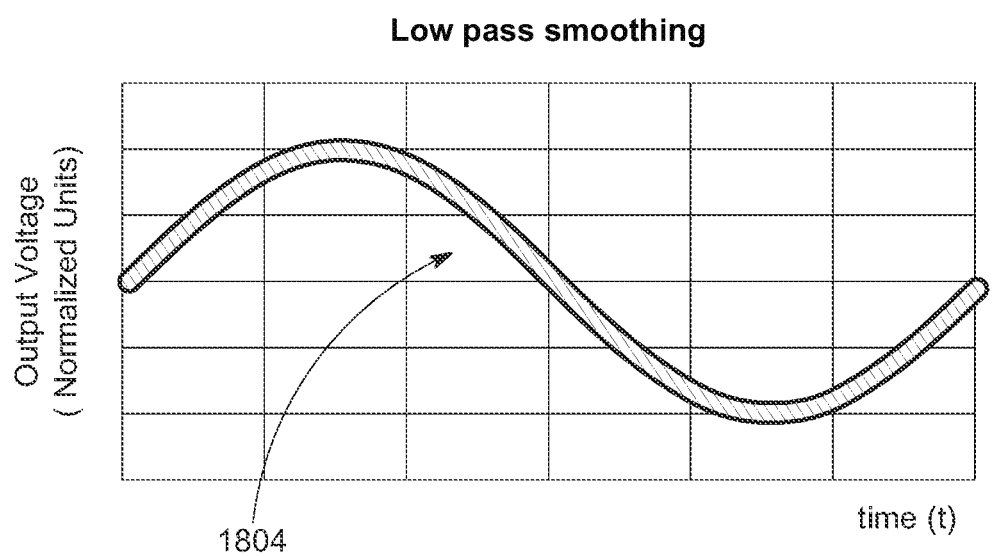
FIG. 18B shows a smoothed version of the waveform in FIG. 18A.

The waveform 1700 in FIG. 17 can be smoothed and/or made continuous, either by the table 1502 itself or in source processing 1510 using a low pass filter. For low-pass smoothing, discrete output values with a non-zero width in time $t_w$ can replace the values in the table of FIG. 16. Note that the table 1600 can vary substantially in length and complexity. In some variations, it can have thousands (e.g., 4000 or more) entries. As shown in FIG. 18A, this creates a "stepped" output waveform 1802. Applying an analog low pass filter to 1802 (e.g., AC DAC output) creates a smooth waveform 1804 shown in FIG. 18B. AC waveform 1804 can be combined with a DC offset setting (not shown) and fed into a closed loop DC sourcing system in Source Processing 1510. This can be part of the hybrid sourcing variations discussed above in the context of FIGS. 2-14.

Transfer Function

Figure 18C:
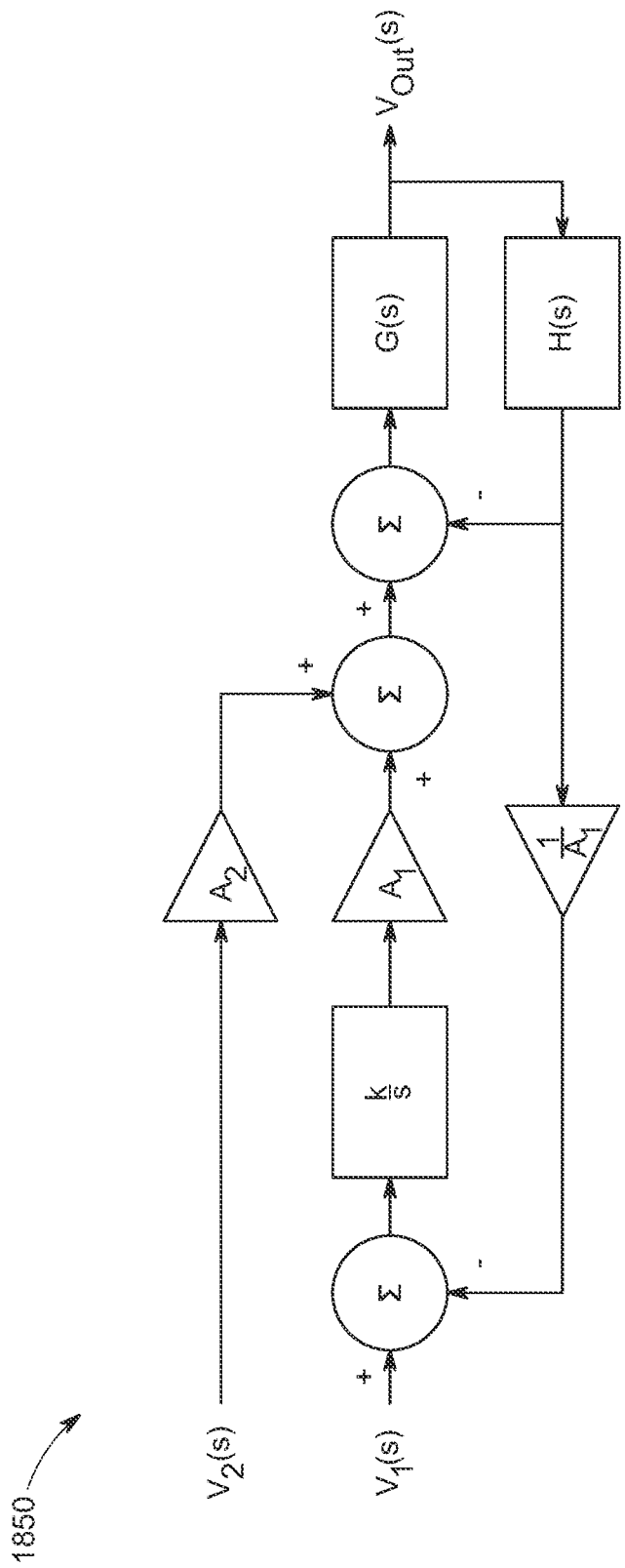
FIG. 18C is a generalized DAC transfer function 1850 that may be used according to aspects of the present disclosure.

FIG. 18C shows a generalized form of an exemplary transfer function 1850 that may be used in conjunction with chain 1400 of the present disclosure. The intent of the analysis performed by 1850 and the associated transfer function is to demonstrate the flat frequency response of the system of 1400. FIG. 18 reduces the circuit to more generic signal elements for analysis of the transfer function.

Transfer function 1850 governs which source, AC ($V_2$) or DC($V_1$), dominates its output $V_{out}$.

$V_{out}$ 1852 of the a generalized hybrid DAC transfer function is given by:

$$V_{out}(s) = \left(\frac{kA_1 V_1(s) + sA_1 V_2(s)}{s + k\left(\frac{G(s)H(s)}{1 + G(s)H(s)}\right)}\right)\left(\frac{G(s)}{1 + G(s)H(s)}\right)$$

It can be assumed that the inner loop is faster than the outer loop. The gain k establishes the transition frequency. Below this frequency $V_1(s)$ dominates. Above this frequency $V_1(s)$+dominates. If $A_1V_1(s)=A_2V_2(s)$, then the outer loop is transparent, leaving the inner loop's transfer function. In the case of a voltage source, G(s) is the open loop transfer function of an op amp, and H(s) is unity. In the case of a current source, G(s) is the open loop transfer function of an op amp, and H(s) is a sense resistor and amplifier.

In either case, the gain $A_1$ should exceed $A_2$. That is, the DC range should be equal to or greater than the AC range. For a current source, the sense resistor is selected for the higher range.

Measurement System Integration

Overview of Measurement System

Figure 19:
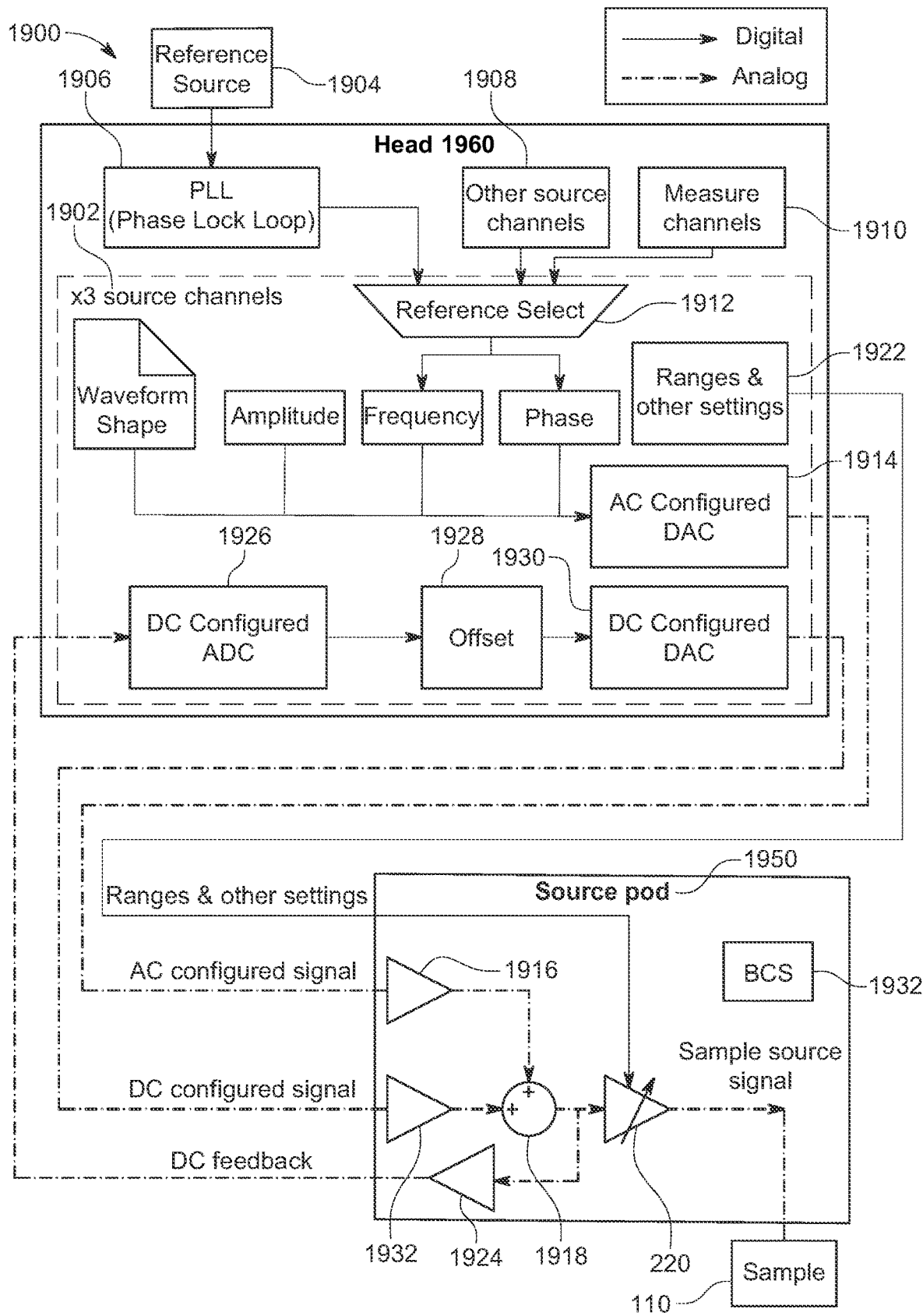
FIG. 19 illustrates a source signal chain 1900 between an exemplary head unit 1960 and an exemplary source pod 1950 according to aspects of the present disclosure.

FIG. 19 shows an exemplary source 1900 configuration with a "Source Pod" 1950 configuration. The source configuration 1900 connects to and controls source pod 1950 by a "head" or control unit 1960. Both source pods 1950 and head units 1960 of system 1900 are described in more detail in U.S. Pat. No. 11,762,050, to Fortney, "INTEGRATED MEASUREMENT SYSTEMS AND METHODS FOR SYNCHRONOUS, ACCURATE MATERIALS PROPERTY MEASUREMENT." It should be understood that, while FIG. 19 shows system 1900 with a particular hybrid DAC, system 1900 may accommodate any such system disclosed herein. In particular, system 1900 may accommodate chains 100, 200, 300, 1300, and 1400.

The Sample source signal (i.e., the signal sent by the chain 1900 to sample 110) is a combination of an AC signal ("AC configured signal") and a DC signal ("DC configured signal"). These signals are combined to create the Sample source signal via a variable gain 220 that can be dynamically ranged to avoid glitching in the signal. The DC configured signal is generated based on DC feedback from the combination of the AC configured signal and the DC configured signal.

More specifically, the AC Configured DAC 1914 provides the AC configured source signal to amplifier 1916 in source pod 1950 where it is combined with a DC configured source signal by 1918 and provided to ranged amplifier 220, then onto sample 110. The waveform shape, amplitude, frequency, and phase of the source provided to the AC Configured DAC 1914 may be pre-programmed, selected by the user, and/or selected among options by the head 1960 according to user preference and/or protocol (e.g., measurement or diagnostic). The output of 1918 is also provide as DC feedback via amplifier 1924 to DC Configured ADC 1926 of the head 102. The DC feedback signal is then sent to a DC Configured DAC 1930 via offset 1928, then routed via amplifier 1932 to 1918.

As shown in FIG. 19, the range of ranged amplifier 220, along with other settings, can be selected by via a "ranges & other settings" signal sent via ranges & other settings element 1922 of head 102. Ranges and other settings may be pre-programmed, selected by the user, and/or selected among options by the head 1960 according to user preference and/or protocol (e.g., measurement or diagnostic).

Source pod 1950 may further include digital (non-analog) circuitry capable of performing various functions, including analysis, communication of data, command information, power regulation, timing, and communication with external devices. In variations, source pod 1950 has the capability to de-activate this non-analog circuitry while providing its source signal or performing a measurement. Doing so decreases the amount of interference and noise in the signal or measurement. For the same reason, digital signals in the source pod 1950 may be isolated from a measurement pod 1950 and the head 102.

Figure 20:
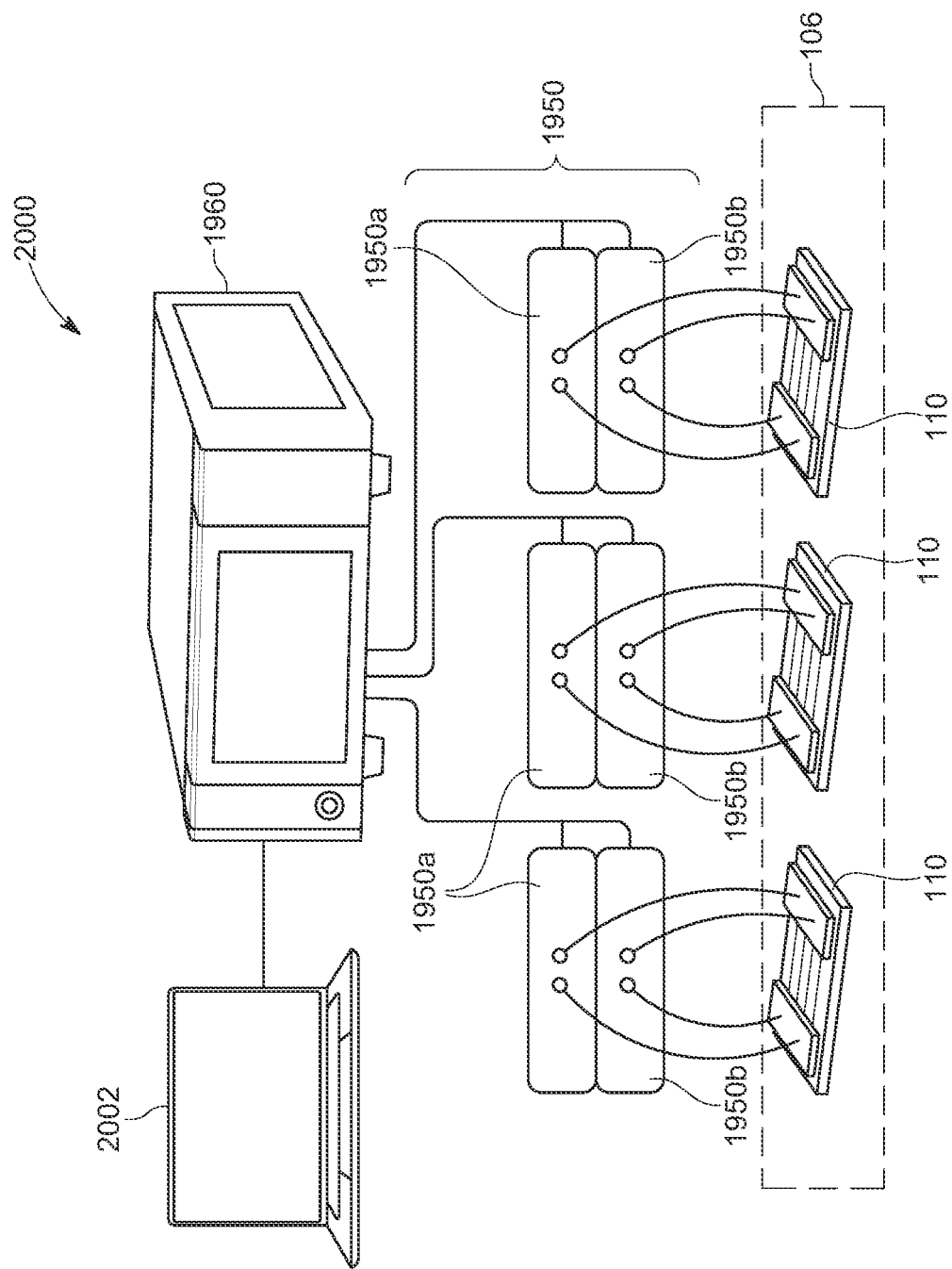
FIG. 20 shows an exemplary measurement system that may be used according to aspects of the present disclosure.

Other variations of system 1900 include any suitable number of heads 1960, source pods and measure pods 1950. For example, FIG. 20 shows another exemplary variation 2000, where a head unit 1960 can have six channels that can support three measure type pods 1950a and three source type pods 1950b. In this variation, the head 1960 is also shown connected to an optional computer 2002 and three exemplary sampled or devices under test (DUTs) 110. Again, this configuration is merely exemplary. There is no requirement for equal numbers of measure 1950a and source 1950b pods. One source 1950a could provide the excitation signal for all three DUTs 110, for example.

Balanced Current Sourcing

As shown in FIG. 19, source pod 1950 may further include balanced current sourcing (BCS) capabilities 1932. BCS 1932 is explained in more detail in U.S. Pat. No. 6,501,255 (the '255 patent) to Pomeroy entitled, "DIFFERENTIAL CURRENT SOURCE WITH ACTIVE COMMON MODE REDUCTION," and filed on Oct. 4, 2001, the entirety of which is herein incorporated by reference.

Briefly, source systems (e.g., 1900) can be vulnerable to inconsistent loading causing current spikes and/or asymmetries between input/out. These spikes may harm components of those systems. There is a need for current balancing in the materials measurement context where both floating and grounded loads can be addressed without substantially altering or rewiring circuitry. BCS 1932 addresses this need.

As discussed in the '255 patent, BCS 1932 drives the load with two modified Howland current sources that are out of phase with one another. In the context of system 1900, BCS 1932 uses a sensing resistor to measure a source current associated with a source signal sent to the sample from the source pod 1950 ("Sample source signal" in FIG. 19). It then varies a resistance range of the sensing resistor according to the magnitude of the measured source current. BCS 1932 can also balance load by altering resistance of either (or both) of the source and measurement pods 1950 based on this source signal measure. For example, when the measured source current exceeds a threshold, the BCS 1932 can increase or decrease the resistance of one or both pods 1950 to lower the current below the threshold. The threshold current may represent, for example, a current above which damage would be done to one or more of the components of system 1900.

Variations inclusive of system 1900 and others may employ chains 100, 200, 300, 1300, and 1400 for additional purposes than those described above. For example, chains 100, 200, 300, 1300, and 1400 may be employed in conjunction, or as part of, current or voltage sources (e.g., to regulate voltage or current output). They may be employed in a temperature controller, other parameter controller, power supply, or a source measure unit (e.g., a device that measures the output of a current or voltage source). They may, for example, operate in conjunction with or as a controller for a source measure unit. They may be employed in other measurement systems (e.g., systems that measure materials parameters: systems that measure current/voltage (I-V) characteristics, resistivity, superconducting transport, force current, voltage, current, transconductance, breakdown/leakage, etc.). Chains 100, 200, 300, 1300, and 1400 may also be incorporated into devices that transmit, receive, and/or supply radio frequency (RF) energy and/or communications and/or other communications.

Although chains 200, 300, 1300, and 1400 have been discussed above as providing only a single analog output, it is to be understood that they may provide multiple analog outputs. For example, the summation 316 of chain 300 may be altered such that it produces two or more combinations of the signals from the AC/High Frequency Path and the DC/Low Frequency path. Similar alterations can be made to 210 and 1312. As discussed above, they can generate one or more harmonic signals.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein.

Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include both the specified value and values within 10% of the specified value, unless expressly stated otherwise. Further, it is to be understood that the drawings accompanying the present application may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

I claim:

1. An analog signal source, comprising:
   two or more digital-to-analog converters (DAC) combined to generate one or more frequency components;
   a first path for generating substantially low frequency signals, the first path comprising a first one of the DACs;
   a second path for generating substantially high frequency signals, the second path comprising a second one of the DACs;
   a data processor for processing an input signal and providing the processed input signal to the first and second paths;
   a combining circuit configured to combine outputs of the first and second paths into the source signal;
   a feedback portion configured to sense the source signal; and
   a servo loop configured to use the sensed source signal to maintain substantial agreement between the source signal and the input signal by removing at least one error causing a disagreement between the source signal and the input signal.

2. The signal source of claim 1, wherein the providing the processed input signal to the first and second paths comprises at least one of:
   feeding a DC input to the first path;
   feeding a low frequency input to at least one of the first path and the second path; and
   feeding a high frequency input to at least one of the first path and the second path.

3. The signal source of claim 1, wherein a bandwidth of the feedback portion is substantially higher than a bandwidth of the first path.

4. The signal source of claim 1, wherein the sensing the source signal comprises comparing the input signal to an output signal of the signal source.

5. The signal source of claim 4, wherein the processing of the input signal by the data processor comprises at least one of:
   removing high frequency signals that are higher than a bandwidth of the first path but within a bandwidth of the feedback portion; and
   removing high frequency signals that are higher than a bandwidth of the feedback portion and higher than a bandwidth of the first path.

6. The signal source of claim 1, wherein the first path is configured for direct current (DC).

7. The signal source of claim 6, wherein the data processor comprises ADC feedback and the processing of the input signal by the data processor comprises:
   comparing the input signal to the source signal; and
   removing from the input signal high frequency signals that are higher than a bandwidth of the first path but within a bandwidth of the feedback portion.

8. The signal source of claim 1, wherein the feedback portion comprises at least one analog-to-digital converter (ADC).

9. The signal source of claim 1, where the second path is configured to accommodate at least one of:
   more than one frequency; and
   complex waveforms characterized by a plurality of frequency components.

10. The signal source of claim 1, wherein the first path comprises an integrater.

11. The signal source of claim 1, wherein:
    the first path comprises a first gain configured to range the first path prior to combining with the second path;
    the second path comprises a second gain configured to range the second path prior to combining with the first path; and
    wherein the first and second gains are configured to operate independently of one another.

12. The signal source of claim 1, wherein the feedback portion comprises signals from outside the signal source.

13. The signal source of claim 1, wherein the first path comprises at least one of a dithering function, a sub-ranging function, and a pulse width modulation in series with the output of the second path.

14. The signal source of claim 1, wherein the second path is configured to at least one of:
    change a DC offset of the low frequency signals faster than a low frequency response time of the servo loop; and
    change a DC offset of low frequency transient information faster than a low frequency response time of the servo loop.

15. The signal source of claim 1, wherein every device in the signal source shares the same clock.

16. The signal source of claim 1, wherein at least one of the first and second paths and the feedback portion comprises at least one of a phase shift and a group delay.

17. The signal source of claim 1, further comprising a third path for generating substantially high frequency signals and wherein the combining circuit is configured to combine outputs of the first, second, and third paths into the source signal.

18. The signal source of claim 1, wherein the outputs of the first path, second path, and feedback portion are accessible to a user via the data processor.

19. The signal source of claim 1, wherein the signal source is used in conjunction with at least one of a voltage source, a current source, a power supply, a source measure unit, a temperature controller, a materials parameter measurement system, and a radio frequency (RF) source.

20. The signal source of claim 1, wherein at least one of:
the combining circuit is configured to combine outputs of the first and second paths into more than one source signal;
the signal source is configured to operate as a controller for a source measure unit; and
the combining circuit is configured to combine outputs of the first and second paths into at least one harmonic signal.

21. A method of sourcing a signal, comprising:
providing an input signal to a data processor;
processing the input signal via the data processor;
sending the processed input signal via the data processor to a first and second path, the first and second paths comprising two or more digital-to-analog converters (DAC) to generate two or more frequency components;
generating, via the first path, a first path output of substantially low frequency signals;
generating, via the second path, a second path output of substantially high frequency signals;
combining the first and second path outputs into a source signal via a combining circuit;
sensing the source signal via a feedback portion;
providing, via the feedback portion, the sensed source signal to a servo loop; and
using the sensed source signal to maintain, via the servo loop, substantial agreement between the source signal and the input signal by removing at least one error causing a disagreement between the source signal and the input signal.

* * * * *